US012641807B2

(12) United States Patent
Park et al.

(10) Patent No.: US 12,641,807 B2
(45) Date of Patent: May 26, 2026

(54) SEMICONDUCTOR DEVICE

(71) Applicant: Samsung Electronics Co., Ltd., Suwon-si (KR)

(72) Inventors: Jangwoo Park, Suwon-si (KR); Dongwoo Kim, Suwon-si (KR); Jinbum Kim, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 340 days.

(21) Appl. No.: 18/539,355

(22) Filed: Dec. 14, 2023

(65) Prior Publication Data

US 2024/0234551 A1 Jul. 11, 2024

(30) Foreign Application Priority Data

Jan. 10, 2023 (KR) ........................ 10-2023-0003459

(51) Int. Cl.
| | |
|---|---|
| *H10D 10/40* | (2025.01) |
| *H10D 62/10* | (2025.01) |
| *H10W 20/40* | (2026.01) |

(52) U.S. Cl.
CPC ............ *H10D 10/40* (2025.01); *H10W 20/40* (2026.01); *H10D 62/121* (2025.01)

(58) Field of Classification Search
CPC ...... H10D 10/40; H10D 62/121; H10D 30/43; H10D 10/051; H10D 62/364; H10D 64/256; H10D 84/85; H10D 84/0109; H10D 84/401; H10D 84/0186; H10D 84/038; H10D 84/0184; H10D 84/856; H10D 84/853; H10D 84/403; H10D 30/6757; H10D 84/121; H10W 20/40
See application file for complete search history.

(56) References Cited

U.S. PATENT DOCUMENTS

| | | | | |
|---|---|---|---|---|
| 4,130,826 | A | 12/1978 | Bachle et al. | |
| 4,138,782 | A * | 2/1979 | De la Moneda ..... | H10D 84/038 |
| | | | | 438/234 |
| 4,855,244 | A * | 8/1989 | Hutter .................. | H10D 84/038 |
| | | | | 257/E21.612 |
| 5,111,269 | A * | 5/1992 | Tsugaru ............... | H10D 84/401 |
| | | | | 257/E27.041 |
| 8,247,300 | B2 | 8/2012 | Babcock et al. | |

(Continued)

OTHER PUBLICATIONS

H. J. Osten et al., "Effects of carbon on boron diffusion in SiGe: Principles and impact on bipolar devices," J. Vac. Sci. Technol. B, 16, 1750 (1998) (5 pages).

*Primary Examiner* — Douglas W Owens
(74) *Attorney, Agent, or Firm* — Muir Patent Law, PLLC

(57) ABSTRACT

A semiconductor device includes first, second, and third epitaxial layers sequentially stacked on a substrate and a first diffusion prevention layer provided in at least one of regions between the first and second epitaxial layers and between the second and third epitaxial layers. The first and third epitaxial layers have a first conductivity type, and the second epitaxial layer has a second conductivity type. The first diffusion prevention layer is configured to prevent an impurity in the second epitaxial layer from being diffused. The first, second, and third epitaxial layers include first, second, and third active patterns, respectively, which are respective provided in upper portions thereof and on collector, base, and emitter regions, respectively, of the substrate.

20 Claims, 24 Drawing Sheets

(56) References Cited

U.S. PATENT DOCUMENTS

| | | | |
|---|---|---|---|
| 8,946,038 B2 | 2/2015 | Hu et al. | |
| 9,117,843 B2 | 8/2015 | Wong et al. | |
| 10,276,700 B2 | 4/2019 | Senapati et al. | |
| 10,388,569 B1 * | 8/2019 | Cheng | H10D 30/014 |
| 10,529,837 B1 | 1/2020 | Hung et al. | |
| 10,930,569 B2 | 2/2021 | Chiang et al. | |
| 11,004,962 B2 | 5/2021 | Langer et al. | |
| 11,189,701 B1 * | 11/2021 | Reznicek | H10D 64/231 |
| 11,289,591 B1 | 3/2022 | Su et al. | |
| 2005/0035431 A1 * | 2/2005 | Masuda | H10D 62/133 |
| | | | 257/E29.183 |
| 2008/0230812 A1 * | 9/2008 | Disney | H01L 21/763 |
| | | | 257/E29.054 |
| 2017/0373171 A1 * | 12/2017 | Sadovnikov | H10D 30/83 |
| 2022/0157953 A1 | 5/2022 | Li et al. | |
| 2022/0181258 A1 | 6/2022 | Liebmann et al. | |
| 2024/0258410 A1 * | 8/2024 | Kim | H10D 10/441 |
| 2024/0274598 A1 * | 8/2024 | Lee | H10D 30/43 |

* cited by examiner

SEMICONDUCTOR DEVICE

CROSS-REFERENCE TO RELATED APPLICATIONS

This U.S. non-provisional patent application claims priority under 35 U.S.C. § 119 to Korean Patent Application No. 10-2023-0003459, filed on Jan. 10, 2023, in the Korean Intellectual Property Office, the entire contents of which are hereby incorporated by reference.

BACKGROUND OF THE INVENTION

The present disclosure relates to a semiconductor device, and in particular, to a semiconductor device including a vertical bipolar junction transistor.

A semiconductor device includes an integrated circuit composed of metal-oxide-semiconductor field-effect transistors (MOS-FETs). To meet an increasing demand for a semiconductor device with a small pattern size and a reduced design rule, the MOS-FETs are being aggressively scaled down. The scale-down of the MOS-FETs may lead to deterioration in operational properties of the semiconductor device. A variety of studies are being conducted to overcome technical limitations associated with the scale-down of the semiconductor device and to realize high-performance semiconductor devices. For example, multi-bridge channel field effect transistors with three-dimensional channel regions are being utilized to enhance an integration density of the semiconductor device. Additionally, structures incorporating bipolar junction transistors, which are compatible to the multi-bridge channel field effect transistors, have been proposed.

SUMMARY

An embodiment of the inventive concept provides a semiconductor device with improved electrical and reliability characteristics.

An embodiment of the inventive concept provides a semiconductor device including a vertical bipolar junction transistor, which has a structure compatible with an MBCFET applied with a backside PDN.

According to an embodiment of the inventive concept, a semiconductor device may include a first epitaxial layer, a second epitaxial layer, and a third epitaxial layer sequentially stacked on a substrate, the first and third epitaxial layers having a first conductivity type, the second epitaxial layer having a second conductivity type, and a first diffusion prevention layer provided in at least one of regions between the first epitaxial layer and the second epitaxial layer and between the second epitaxial layer and the third epitaxial layer. The first diffusion prevention layer may be configured to prevent an impurity in the second epitaxial layer from being diffused. The first epitaxial layer may include a first active pattern in an upper portion thereof, the second epitaxial layer may include a second active pattern in an upper portion thereof, and the third epitaxial layer may include a third active pattern in an upper portion thereof. The first active pattern may be provided on a collector region of the substrate, the second active pattern may be provided on a base region of the substrate, and the third active pattern may be provided on an emitter region of the substrate.

According to an embodiment of the inventive concept, a semiconductor device may include a first epitaxial layer, a second epitaxial layer, and a third epitaxial layer sequentially stacked on a substrate, the first and third epitaxial layers having a first conductivity type, the second epitaxial layer having a second conductivity type, a first diffusion prevention layer between the substrate and the first epitaxial layer, a second diffusion prevention layer between the first epitaxial layer and the second epitaxial layer, and a third diffusion prevention layer between the second epitaxial layer and the third epitaxial layer. The first diffusion prevention layer may include silicon (Si) and a first diffusion prevention element, and the second diffusion prevention layer may include silicon (Si) and a second diffusion prevention element. The first diffusion prevention element may be different from the second diffusion prevention element.

According to an embodiment of the inventive concept, a semiconductor device may include a first epitaxial layer, a second epitaxial layer, and a third epitaxial layer sequentially stacked on a substrate, the first and third epitaxial layers having a first conductivity type, the second epitaxial layer having a second conductivity type, a first diffusion prevention layer between the first epitaxial layer and the second epitaxial layer, a second diffusion prevention layer between the second epitaxial layer and the third epitaxial layer, and a power delivery network layer on a bottom surface of the substrate. The substrate may have a first thickness in a vertical direction, and a total thickness of the first to third epitaxial layers, which are sequentially stacked, may be a second thickness. The first thickness may be larger than the second thickness.

DETAILED DESCRIPTION

Example embodiments will be more clearly understood from the following detailed description taken in conjunction with the accompanying drawings, in which like numerals refer to like elements throughout.

As used herein, terms such as "same," "equal," "planar," or "coplanar," when referring to orientation, layout, location, shapes, sizes, amounts, or other measures do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes. The term "substantially" may be used herein to emphasize this meaning, unless the context or other statements indicate otherwise.

It will be understood that when an element is referred to as being "connected" or "coupled" to or "on" another element, it can be directly connected or coupled to or on the other element or intervening elements may be present. In contrast, when an element is referred to as being "directly connected" or "directly coupled" to another element, or as "contacting" or "in contact with" another element (or using any form of the word "contact"), there are no intervening elements present at the point of contact.

Ordinal numbers such as "first," "second," "third," etc. may be used simply as labels of certain elements, steps, etc., to distinguish such elements, steps, etc. from one another. Terms that are not described using "first," "second," etc., in the specification, may still be referred to as "first" or "second" in a claim. In addition, a term that is referenced with a particular ordinal number (e.g., "first" in a particular claim) may be described elsewhere with a different ordinal number (e.g., "second" in the specification or another claim).

Figure 1:
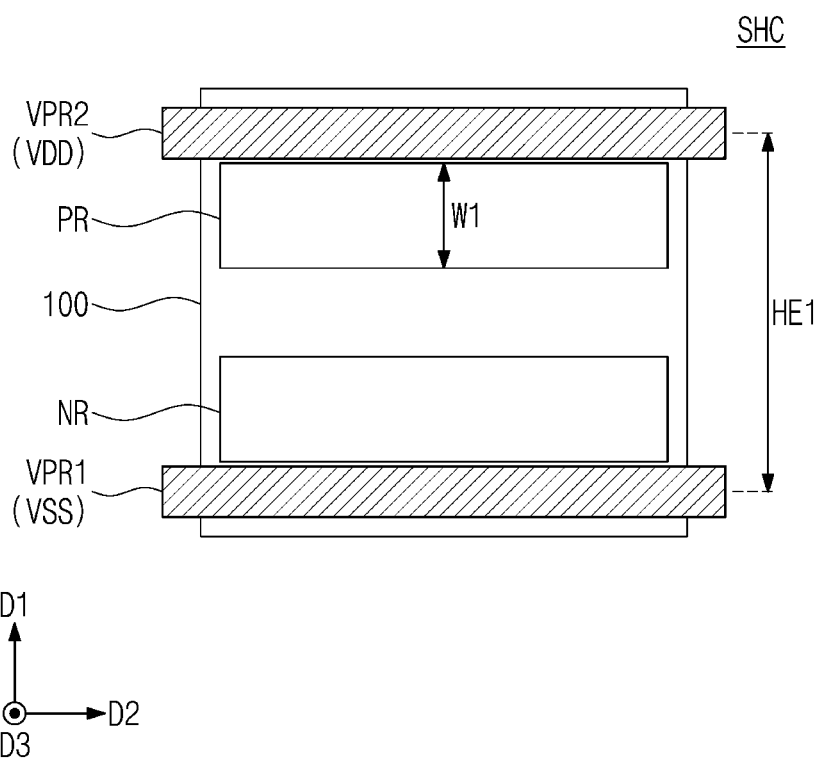
FIGS. 1 to 3 are conceptual diagrams illustrating logic cells of a semiconductor device, according to an example embodiment of the inventive concept.
Figure 2:
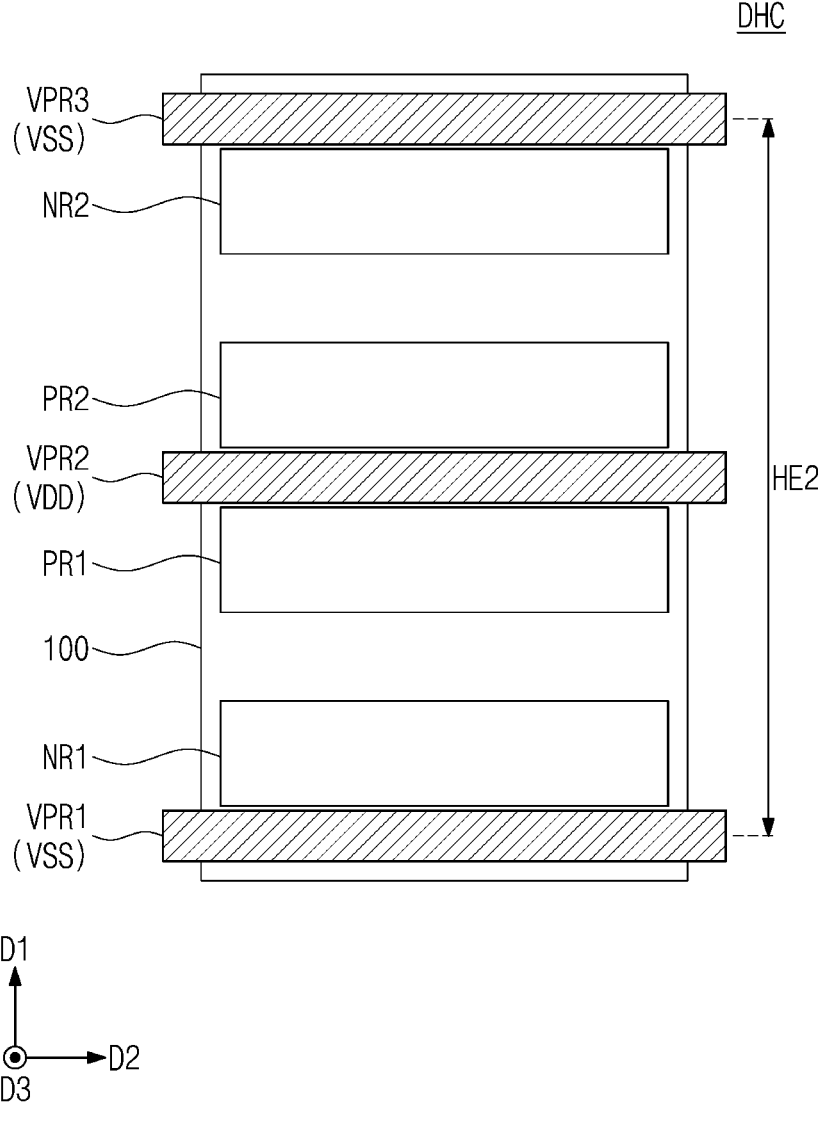
Figure 3:
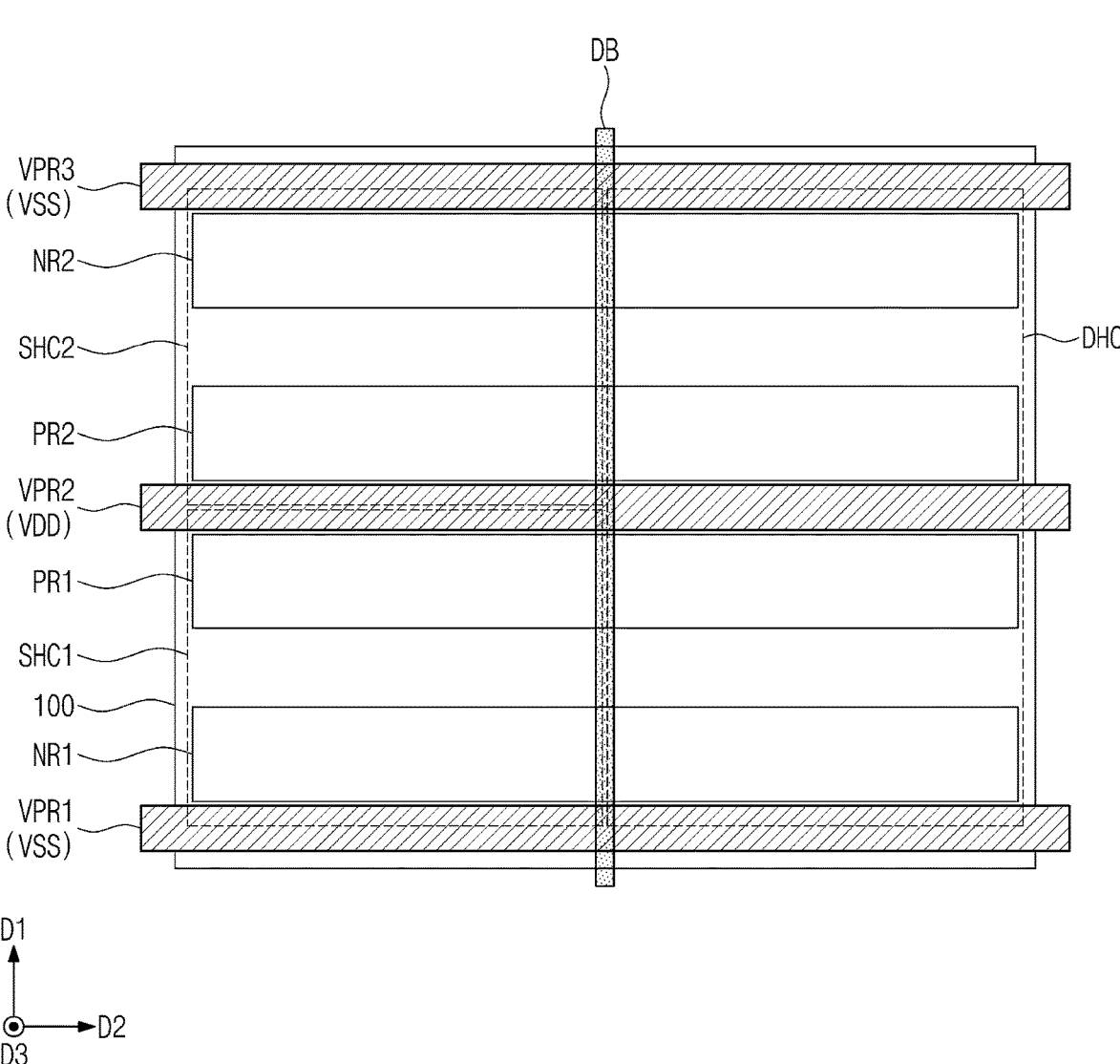

FIGS. 1 to 3 are conceptual diagrams illustrating logic cells in a semiconductor device according to an example embodiment of the inventive concept.

Referring to FIG. 1, a single height cell SHC may be provided. In detail, a first lower power line VPR1 and a second lower power line VPR2 may be provided in a lower portion of a substrate 100. The first lower power line VPR1 may be a conduction path, to which a source voltage VSS (e.g., a ground voltage) is provided. The second lower power line VPR2 may be a conduction path, to which a drain voltage VDD (e.g., a power voltage) is provided.

The single height cell SHC may be defined between the first lower power line VPR1 and the second lower power line VPR2. The single height cell SHC may include one PMOS-FET region PR and one NMOSFET region NR. In other words, the single height cell SHC may have a CMOS structure provided between the first lower power line VPR1 and the second lower power line VPR2.

Each of the PMOSFET and NMOSFET regions PR and NR may have a first width in a first direction D1. A length of the single height cell SHC in the first direction D1 may be defined as a first height HE1. The first height HE1 may be substantially equal to a distance (e.g., pitch) between the first lower power line VPR1 and the second lower power line VPR2.

The single height cell SHC may constitute a single logic cell. In the present specification, the logic cell may mean a logic device (e.g., AND, OR, XOR, XNOR, inverter, and so forth), which is configured to execute a specific function. In other words, the logic cell may include transistors constituting the logic device and interconnection lines connecting transistors to each other.

Referring to FIG. 2, a double height cell DHC may be provided. In detail, the first lower power line VPR1, the second lower power line VPR2, and a third lower power line VPR3 may be provided on the substrate 100. The second lower power line VPR2 may be disposed between the first lower power line VPR1 and the third lower power line VPR3. The third lower power line VPR3 may be a conduction path, to which the source voltage VSS is provided.

The double height cell DHC may be defined between the first lower power line VPR1 and the third lower power line VPR3. The double height cell DHC may include a first PMOSFET region PR1, a second PMOSFET region PR2, a first NMOSFET region NR1, and a second NMOSFET region NR2.

The first NMOSFET region NR1 may be adjacent to the first lower power line VPR1. The second NMOSFET region NR2 may be adjacent to the third lower power line VPR3. The first and second PMOSFET regions PR1 and PR2 may be adjacent to the second lower power line VPR2. When viewed in a plan view, the second lower power line VPR2 may be disposed between the first and second PMOSFET regions PR1 and PR2.

A length of the double height cell DHC in the first direction D1 may be defined as a second height HE2. The second height HE2 may be about two times the first height HE1 of FIG. 1. The first and second PMOSFET regions PR1 and PR2 of the double height cell DHC may be combined to serve as a single PMOSFET region. Thus, a channel size of the PMOS transistor of the double height cell DHC may be larger than a channel size of the PMOS transistor of the single height cell SHC of FIG. 1.

For example, the channel size of the PMOS transistor of the double height cell DHC may be about two times the channel size of the PMOS transistor of the single height cell SHC. In this case, the double height cell DHC may be operated at a higher speed than the single height cell SHC. In an embodiment, the double height cell DHC shown in FIG. 2 may be defined as a multi-height cell. Although not shown, the multi-height cell may include a triple height cell whose cell height is about three times that of the single height cell SHC.

Referring to FIG. 3, a first single height cell SHC1, a second single height cell SHC2, and a double height cell DHC may be two-dimensionally arranged on the substrate 100. The first single height cell SHC1 may be disposed between the first and second lower power lines VPR1 and VPR2. The second single height cell SHC2 may be disposed between the second and third lower power lines VPR2 and VPR3. The second single height cell SHC2 may be adjacent to the first single height cell SHC1 in the first direction D1.

The double height cell DHC may be disposed between the first and third lower power lines VPR1 and VPR3. The double height cell DHC may be adjacent to the first and second single height cells SHC1 and SHC2 in a second direction D2.

A division structure DB may be provided between the first single height cell SHC1 and the double height cell DHC and between the second single height cell SHC2 and the double height cell DHC. An active region of the double height cell DHC may be electrically disconnected from an active region of each of the first and second single height cells SHC1 and SHC2 by the division structure DB.

Figure 4:
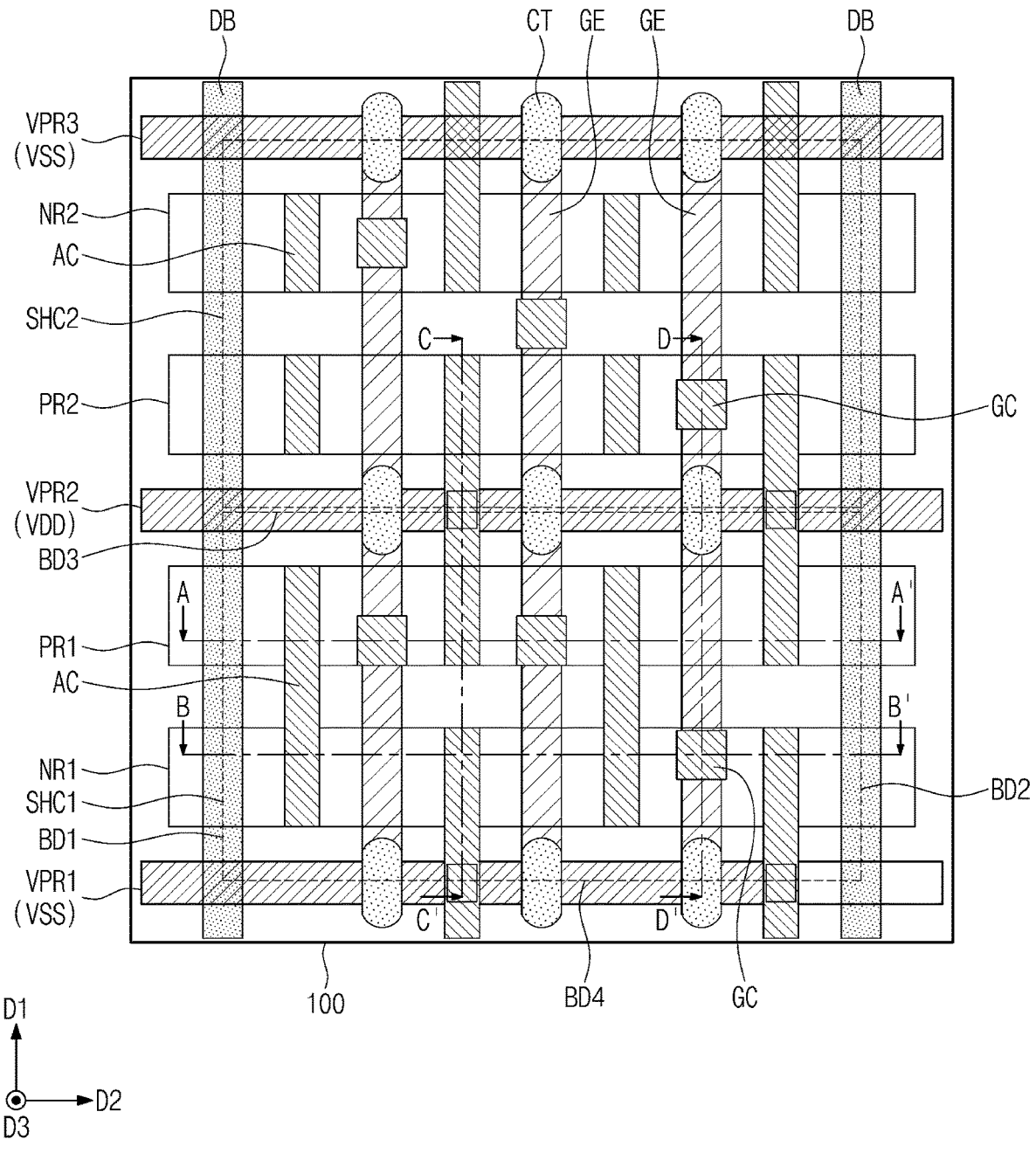
FIG. 4 is a plan view illustrating a semiconductor device, according to an example embodiment of the inventive concept.

FIG. 4 is a plan view illustrating a semiconductor device according to an example embodiment of the inventive concept. FIGS. 5A to 5D are sectional views taken along lines A-A', B-B', C-C', and D-D' of FIG. 4, respectively. FIGS. 4 and 5A to 5D illustrate an example of a detailed structure of the first and second single height cells SHC1 and SHC2 of FIG. 3.

Referring to FIG. 4 and FIGS. 5A to 5D, the first and second single height cells SHC1 and SHC2 may be provided on the substrate 100. Logic transistors constituting a logic circuit may be disposed on each of the first and second single height cells SHC1 and SHC2. The substrate 100 may be a semiconductor substrate that is formed of or includes silicon, germanium, silicon germanium, a compound semiconductor material, or the like. In an embodiment, the substrate 100 may be a silicon wafer.

The substrate 100 may include the first PMOSFET region PR1, the second PMOSFET region PR2, the first NMOSFET region NR1, and the second NMOSFET region NR2.

Each of the first PMOSFET region PR1, the second PMOS-FET region PR2, the first NMOSFET region NR1, and the second NMOSFET region NR2 may extend lengthwise in the second direction D2. The first single height cell SHC1 may include the first NMOSFET region NR1 and the first PMOSFET region PR1, and the second single height cell SHC2 may include the second PMOSFET region PR2 and the second NMOSFET region NR2.

A first active pattern AP1 and a second active pattern AP2 may be defined by trenches TR, which are formed in an upper portion of the substrate 100. The first active pattern AP1 may be provided on each of the first and second PMOSFET regions PR1 and PR2. The second active pattern AP2 may be provided on each of the first and second NMOSFET regions NR1 and NR2. The first and second active patterns AP1 and AP2 may extend lengthwise in the second direction D2. Each of the first and second active patterns AP1 and AP2 may be a vertically-protruding portion of the substrate 100. For example, the first and second active patterns AP1 and AP2 may protrude above a main surface of the substrate 100. The first and second active patterns AP1 and AP2 may be either part of the substrate 100 (e.g., being formed by etching the substrate 100) or formed on the substrate (e.g., epitaxially grown from the substrate 100). A device isolation layer ST may be provided to fill the trenches TR. The device isolation layer ST may be formed of or include silicon oxide. The device isolation layer ST may not cover first and second channel patterns CH1 and CH2 to be described below.

A first channel pattern CH1 may be provided on the first active pattern AP1. A second channel pattern CH2 may be provided on the second active pattern AP2. Each of the first and second channel patterns CH1 and CH2 may include a first semiconductor pattern SP1, a second semiconductor pattern SP2, and a third semiconductor pattern SP3, which are sequentially stacked. The first to third semiconductor patterns SP1, SP2, and SP3 may be spaced apart from each other in a vertical direction (e.g., a third direction D3).

Each of the first to third semiconductor patterns SP1, SP2, and SP3 may be formed of or include at least one of silicon (Si), germanium (Ge), or silicon germanium (SiGe). For example, each of the first to third semiconductor patterns SP1, SP2, and SP3 may be formed of or include crystalline silicon. In an embodiment, each of the first to third semiconductor patterns SP1, SP2, and SP3 may be a nanosheet.

A plurality of first source/drain patterns SD1 may be provided on the first active pattern AP1. A plurality of first recesses RS1 may be formed in an upper portion of the first active pattern AP1. The first source/drain patterns SD1 may be provided in the first recesses RS1, respectively. The first source/drain patterns SD1 may be impurity regions of a first conductivity type (e.g., p-type). The first channel pattern CH1 may be interposed between each pair of the first source/drain patterns SD1. For example, each pair of the first source/drain patterns SD1 may be connected to each other by the stacked first to third semiconductor patterns SP1, SP2, and SP3.

A plurality of second source/drain patterns SD2 may be provided on the second active pattern AP2. A plurality of second recesses RS2 may be formed in an upper portion of the second active pattern AP2. The second source/drain patterns SD2 may be provided in the second recesses RS2, respectively. The second source/drain patterns SD2 may be impurity regions of a second conductivity type (e.g., n-type). The second channel pattern CH2 may be interposed between a pair of the second source/drain patterns SD2. For example, each pair of the second source/drain patterns SD2 may be connected to each other by the stacked first to third semiconductor patterns SP1, SP2, and SP3.

The first and second source/drain patterns SD1 and SD2 may be epitaxial patterns, which are formed by a selective epitaxial growth (SEG) process. As an example, a top surface of each of the first and second source/drain patterns SD1 and SD2 may be positioned at substantially the same level as a top surface of the third semiconductor pattern SP3. However, in an embodiment, the top surface of each of the first and second source/drain patterns SD1 and SD2 may be higher than the top surface of the third semiconductor pattern SP3.

The first source/drain patterns SD1 may include a semiconductor material (e.g., SiGe) whose lattice constant is greater than that of the substrate 100. In this case, the pair of the first source/drain patterns SD1 may exert a compressive stress on the first channel patterns CH1 therebetween. The second source/drain patterns SD2 may be formed of or include the same semiconductor element (e.g., Si) as the substrate 100.

Each of the first source/drain patterns SD1 may include a buffer layer BFL and a main layer MAL on the buffer layer BFL. Referring back to FIG. 5A, the buffer layer BFL may cover an inner surface the first recess RS1. In an embodiment, the buffer layer BFL may have a substantially conformal thickness. For example, a thickness of the buffer layer BFL, which is measured in the third direction D3 on a bottom of the first recess RS1, may be substantially equal to a thickness of the buffer layer BFL, which is measured in the second direction D2 at a top level of the first recess RS1.

In an embodiment, the buffer layer BFL may have a decreasing thickness in an upward direction. For example, the thickness of the buffer layer BFL, which is measured in the third direction D3 on the bottom of the first recess RS1, may be larger than a thickness of the buffer layer BFL, which is measured in the second direction D2 at the top level of the first recess RS1. In addition, the buffer layer BFL may have a 'U'-shaped section corresponding to a profile of the first recess RS1.

The main layer MAL may fill most of an unfilled region of the first recess RS1 covered with the buffer layer BFL. The main layer MAL may have a volume that is greater than that of the buffer layer BFL. Each of the buffer and main layers BFL and MAL may be formed of or include silicon germanium (SiGe). In detail, the buffer layer BFL may contain a relatively low concentration of germanium (Ge). In another embodiment, the buffer layer BFL may contain only silicon (Si), without germanium (Ge). A germanium concentration of the buffer layer BFL may range from 0 at % to 10 at %.

The main layer MAL may contain a relatively high concentration of germanium. In an embodiment, the germanium concentration of the main layer MAL may range from 30 at % to 70 at %. The germanium concentration of the main layer MAL may increase in the third direction D3. For example, a portion of the main layer MAL, which is adjacent to the buffer layer BFL, may have a germanium concentration of about 40 at %, and an upper portion of the main layer MAL may have a germanium concentration of about 60 at %.

Each of the buffer and main layers BFL and MAL may contain an impurity (e.g., boron, gallium, or indium) that allows the first source/drain pattern SD1 to have a p-type conductivity. The impurity concentration of each of the buffer and main layers BFL and MAL may range from 1E18 atoms/cm$^3$ to 5E22 atoms/cm$^3$. The impurity concentration of the main layer MAL may be higher than the impurity concentration of the buffer layer BFL.

The buffer layer BFL may prevent a stacking fault between the substrate 100 (i.e., the first active pattern APT) and the main layer MAL and between the first to third semiconductor patterns SP1, SP2, and SP3 and the main layer MAL. The stacking fault may lead to an increase of a channel resistance. The buffer layer BFL may be used to protect the main layer MAL in a process of replacing sacrificial layers with first to third inner electrodes PO1, PO2, and PO3 of a gate electrode GE. In other words, the buffer layer BFL may prevent an etchant material, which is used to remove the sacrificial layers, from entering and etching the main layer MAL.

Each of the second source/drain patterns SD2 may be formed of or include silicon (Si). The second source/drain pattern SD2 may further contain impurities (e.g., phosphorus, arsenic, or antimony) that allow the second source/drain pattern SD2 to have an n-type conductivity. The impurity concentration of the second source/drain pattern SD2 may range from 1E18 atom/cm³ to 5E22 atom/cm³.

The gate electrodes GE may be provided to cross the first and second channel patterns CH1 and CH2 and to extend in the first direction D1. The gate electrodes GE may be arranged at a first pitch in the second direction D2. Each of the gate electrodes GE may be vertically overlapped with the first and second channel patterns CH1 and CH2.

The gate electrode GE may include a first inner electrode PO1 interposed between the active pattern AP1 or AP2 and the first semiconductor pattern SP1, a second inner electrode PO2 interposed between the first semiconductor pattern SP1 and the second semiconductor pattern SP2, a third inner electrode PO3 interposed between the second semiconductor pattern SP2 and the third semiconductor pattern SP3, and an outer electrode PO4 on the third semiconductor pattern SP3.

Referring back to FIG. 5D, the gate electrode GE may be provided on a top surface TS, a bottom surface BS, and opposite side surfaces SW of each of the first to third semiconductor patterns SP1, SP2, and SP3. That is, the transistor according to the present embodiment may be a three-dimensional field effect transistor (e.g., MBCFET or GAAFET) in which the gate electrode GE is provided to three-dimensionally surround the channel pattern.

As an example, the first single height cell SHC1 may have a first border BD1 and a second border BD2, which are opposite to each other in the second direction D2. The first and second borders BD1 and BD2 may extend lengthwise in the first direction D1. The first single height cell SHC1 may have a third border BD3 and a fourth border BD4, which are opposite to each other in the first direction D1. The third and fourth borders BD3 and BD4 may extend lengthwise in the second direction D2.

Gate cutting patterns CT may be disposed on borders, which are parallel to the second direction D2, of each of the first and second single height cells SHC1 and SHC2. For example, the gate cutting patterns CT may be disposed on the third and fourth borders BD3 and BD4 of the first single height cell SHC1. The gate cutting patterns CT may be arranged at the first pitch along the third border BD3. The gate cutting patterns CT may be arranged at the first pitch along the fourth border BD4. When viewed in a plan view, the gate cutting patterns CT on the third and fourth borders BD3 and BD4 may be overlapped with the gate electrodes GE, respectively. The gate cutting patterns CT may be formed of or include at least one of insulating materials (e.g., silicon oxide, silicon nitride, or a combination thereof).

The gate electrode GE on the first single height cell SHC1 may be separated from the gate electrode GE on the second single height cell SHC2 by the gate cutting pattern CT. The gate cutting pattern CT may be interposed between the gate electrodes GE, which are placed on the first and second single height cells SHC1 and SHC2 aligned to each other in the first direction D1. That is, the gate electrode GE extending in the first direction D1 may be divided into a plurality of the gate electrodes GE by the gate cutting patterns CT.

Referring back to FIG. 4 and FIGS. 5A to 5D, a pair of gate spacers GS may be respectively disposed on opposite side surfaces of the outer electrode PO4 of the gate electrode GE. The gate spacers GS may be extended along the gate electrode GE and in the first direction D1. Top surfaces of the gate spacers GS may be higher than a top surface of the gate electrode GE. The top surfaces of the gate spacers GS may be coplanar with a top surface of a first interlayer insulating layer 110, which will be described below. The gate spacers GS may be formed of or include at least one of SiCN, SiCON, or SiN. In an embodiment, the gate spacers GS may be a multi-layered structure, which includes at least two different materials selected from SiCN, SiCON, and SiN.

A gate capping pattern GP may be provided on the gate electrode GE. The gate capping pattern GP may be extended along the gate electrode GE or in the first direction D1. The gate capping pattern GP may be formed of or include a material having an etch selectivity with respect to first and second interlayer insulating layers 110 and 120, which will be described below. In detail, the gate capping pattern GP may be formed of or include at least one of SiON, SiCN, SiCON, or SiN.

A gate insulating layer GI may be interposed between the gate electrode GE and the first channel pattern CH1 and between the gate electrode GE and the second channel pattern CH2. The gate insulating layer GI may cover the top surface TS, the bottom surface BS, and opposite side surfaces SW of each of the first to third semiconductor patterns SP1, SP2, and SP3. The gate insulating layer GI may cover the top surface of the device isolation layer ST below the gate electrode GE.

In an embodiment, the gate insulating layer GI may include a silicon oxide layer, a silicon oxynitride layer, and/or a high-k dielectric layer. The high-k dielectric layer may be formed of or include at least one of high-k dielectric materials whose dielectric constants are higher than that of silicon oxide. For example, the high-k dielectric material may include at least one of hafnium oxide, hafnium silicon oxide, hafnium zirconium oxide, hafnium tantalum oxide, lanthanum oxide, zirconium oxide, zirconium silicon oxide, tantalum oxide, titanium oxide, barium strontium titanium oxide, barium titanium oxide, strontium titanium oxide, lithium oxide, aluminum oxide, lead scandium tantalum oxide, or lead zinc niobate.

The gate electrode GE may include a first metal pattern and a second metal pattern on the first metal pattern. The first metal pattern may be provided on the gate insulating layer GI and may be adjacent to the first to third semiconductor patterns SP1, SP2, and SP3. The first metal pattern may include a work-function metal, which can be used to adjust a threshold voltage of the transistor. By adjusting a thickness and composition of the first metal pattern, it may be possible to realize a transistor having a desired threshold voltage. For example, the first to third inner electrodes PO1, PO2, and PO3 of the gate electrode GE may be composed of the first metal pattern including the work-function metal.

The first metal pattern may include a metal nitride layer. For example, the first metal pattern may include a layer that is composed of at least one metallic material, which is selected from the group consisting of titanium (Ti), tantalum (Ta), aluminum (Al), tungsten (W) and molybdenum (Mo), and nitrogen (N). In an embodiment, the first metal pattern may further include carbon (C). The first metal pattern may include a plurality of work function metal layers which are stacked.

The second metal pattern may be formed of or include a metallic material whose resistance is lower than the first metal pattern. For example, the second metal pattern may include at least one metallic material, which is selected from the group consisting of tungsten (W), aluminum (Al), titanium (Ti), and tantalum (Ta). In an embodiment, the outer electrode PO4 of the gate electrode GE may include the first metal pattern and the second metal pattern on the first metal pattern.

Referring back to FIG. 5B, inner spacers IP may be provided on the first and second NMOSFET regions NR1 and NR2. That is, the inner spacers IP may be provided on the second active pattern AP2. The inner spacers IP may be respectively interposed between the second source/drain pattern SD2 and the first to third inner electrodes PO1, PO2, and PO3 of the gate electrode GE. The inner spacers IP may be in direct contact with the second source/drain pattern SD2. Each of the first to third inner electrodes PO1, PO2, and PO3 of the gate electrode GE may be spaced apart from the second source/drain pattern SD2 by the inner spacer IP.

A first interlayer insulating layer 110 may be provided on the substrate 100. The first interlayer insulating layer 110 may cover the gate spacers GS and the first and second source/drain patterns SD1 and SD2. The first interlayer insulating layer 110 may contact the gate spacers GS and the first and second source/drain patterns SD1 and SD2. The first interlayer insulating layer 110 may have a top surface that is substantially coplanar with the top surface of the gate capping pattern GP and the top surface of the gate spacer GS. A second interlayer insulating layer 120 may be formed on the first interlayer insulating layer 110 to cover the gate capping pattern GP. A third interlayer insulating layer 130 may be provided on the second interlayer insulating layer 120. A fourth interlayer insulating layer 140 may be provided on the third interlayer insulating layer 130. For example, the fourth interlayer insulating layer 140 may contact a top surface of the third interlayer insulating layer 130, the third interlayer insulating layer 130 may contact a top surface of the second interlayer insulating layer 120, and the second interlayer insulating layer 120 may contact a top surface of the first interlayer insulating layer 110. In an embodiment, at least one of the first to fourth interlayer insulating layers 110 to 140 may include a silicon oxide layer.

A pair of division structures DB may be provided at both sides of each of the first and second single height cells SHC1 and SHC2 to be opposite to each other in the second direction D2. For example, a pair of the division structures DB may be respectively provided on the first and second borders BD1 and BD2 of the first single height cell SHC1. The division structures DB may extend lengthwise in the first direction D1 to be parallel to the gate electrodes GE. A pitch between each of the division structures DB and the gate electrode GE adjacent thereto may be equal to the first pitch.

The division structures DB may be provided to penetrate the gate capping pattern GP and the gate electrode GE and may be extended into the first and second active patterns AP1 and AP2. The division structure DB may be provided to penetrate an upper portion of each of the first and second active patterns AP1 and AP2. For example, a bottom surface of each of the division structures DB may be at a lower level than a top surface of the first and second active patterns AP1 and AP2 into which the division structures DB extend. The division structure DB may electrically separate an active region of each of the first and second single height cells SHC1 and SHC2 from an active region of a neighboring cell.

Active contacts AC may be provided to penetrate the first and second interlayer insulating layers 110 and 120 and to be electrically connected to the first and second source/drain patterns SD1 and SD2, respectively. A pair of the active contacts AC may be respectively provided at both sides of the gate electrode GE. When viewed in a plan view, the active contact AC may be a bar-shaped pattern that extends lengthwise in the first direction D1.

The active contact AC may be a self-aligned contact. For example, the active contact AC may be formed by a self-alignment process using the gate capping pattern GP and the gate spacer GS. For example, the active contact AC may cover at least a portion of the side surface of the gate spacer GS. Although not shown, the active contact AC may be provided to cover a portion of the top surface of the gate capping pattern GP.

Metal-semiconductor compound layers SC (e.g., silicide layers) may be respectively interposed between the active contact AC and the first source/drain pattern SD1 and between the active contact AC and the second source/drain pattern SD2. For example, the metal-semiconductor compound layers SC interposed between the active contact AC and the first source/drain pattern SD1 may contact the active contact AC and the first source/drain pattern SD1, and the metal-semiconductor compound layers SC interposed between the active contact AC and the second source/drain pattern SD2 may contact the active contact AC and the second source/drain pattern SD2. In example embodiments, the metal-semiconductor compound layers SC may contact the bottom surface and a lower portion of the side surface of the active contact AC. The active contact AC may be electrically connected to the source/drain pattern SD1 or SD2 through the metal-semiconductor compound layer SC. For example, the metal-semiconductor compound layer SC may be formed of or include at least one of titanium silicide, tantalum silicide, tungsten silicide, nickel silicide, or cobalt silicide.

Gate contacts GC may be provided to penetrate the second interlayer insulating layer 120 and the gate capping pattern GP and may be electrically connected to the gate electrodes GE, respectively. When viewed in a plan view, two gate contacts GC on the first single height cell SHC1 may be disposed to be overlapped with the first PMOSFET region PR1. For example, the two gate contacts GC on the first single height cell SHC1 may be provided on the first active pattern AP1 (e.g., see FIG. 5A). When viewed in a plan view, one gate contact GC on the first single height cell SHC1 may be disposed to be overlapped with the first NMOSFET region NR1. For example, the one gate contact GC on the first single height cell SHC1 may be provided on the second active pattern AP2 (e.g., see FIG. 5B).

The gate contact GC may be freely disposed on the gate electrode GE, without any restrictions on its position. For example, the gate contacts GC on the second single height cell SHC2 may be respectively disposed on the second PMOSFET region PR2, the second NMOSFET region NR2, and the device isolation layer ST filling the trench TR (e.g., see FIG. 4).

Figure 5A:
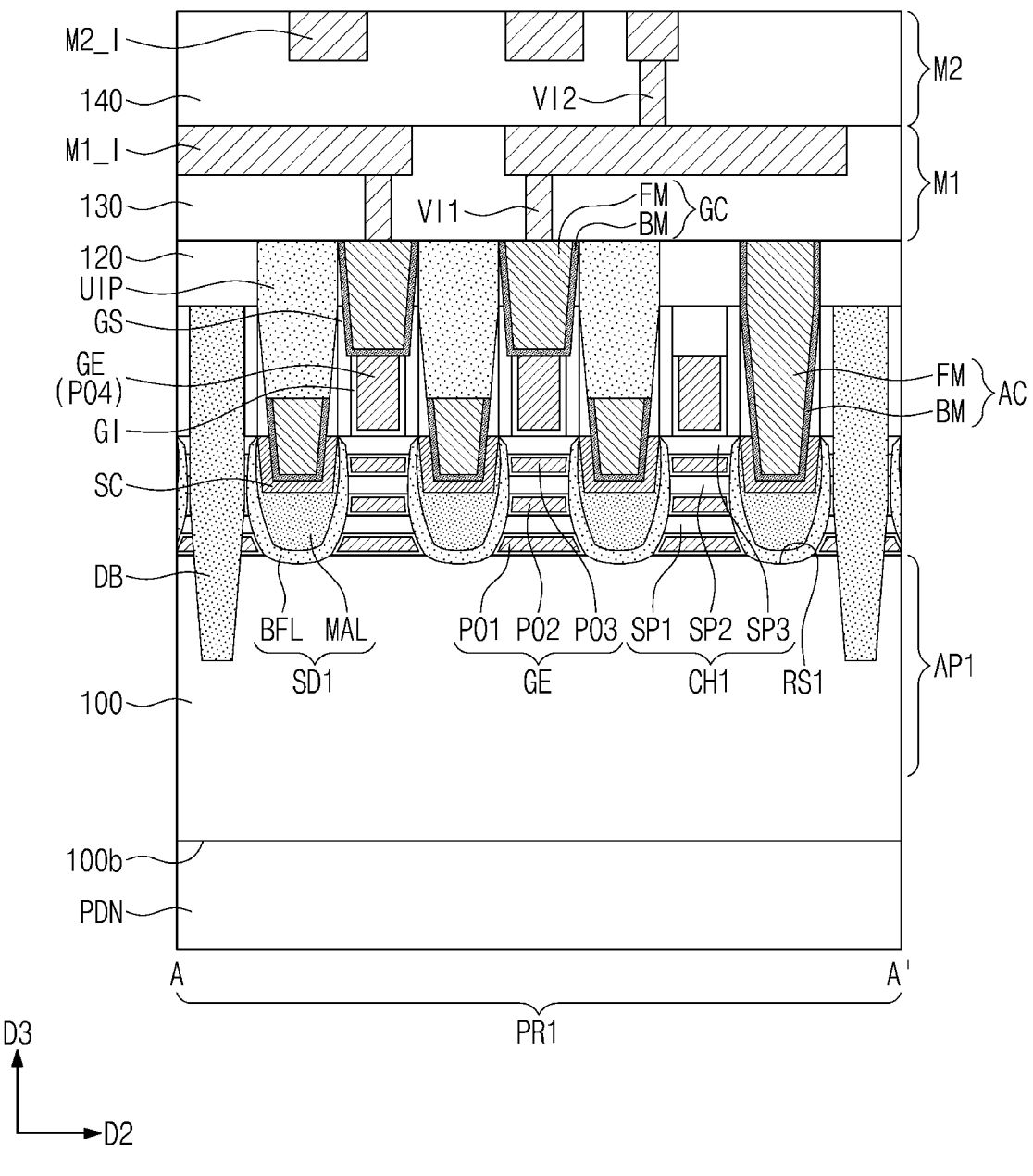
FIGS. 5A to 5D are sectional views taken along lines A-A', B-B', C-C', and D-D' of FIG. 4, respectively.
Figure 5B:
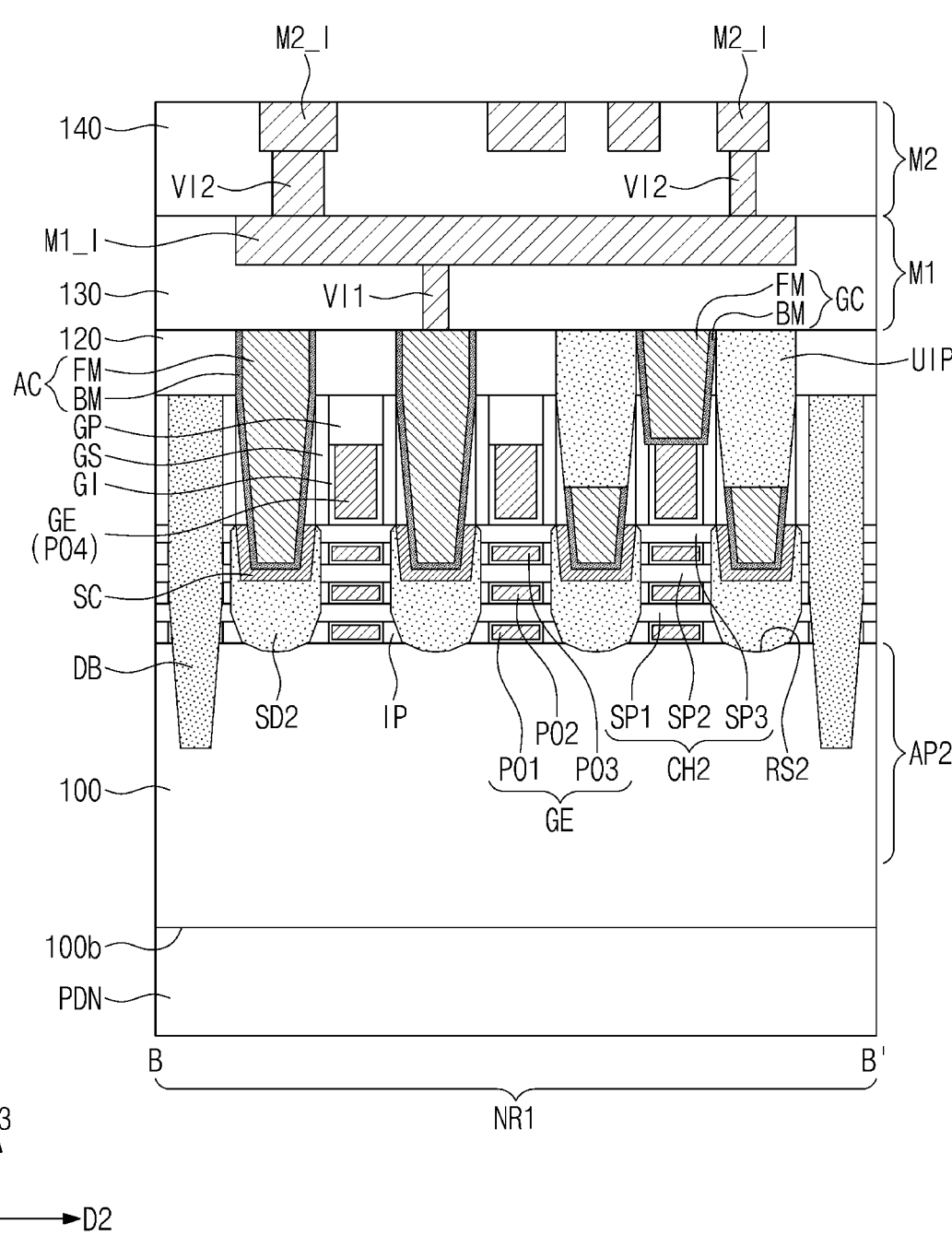
Figure 5C:
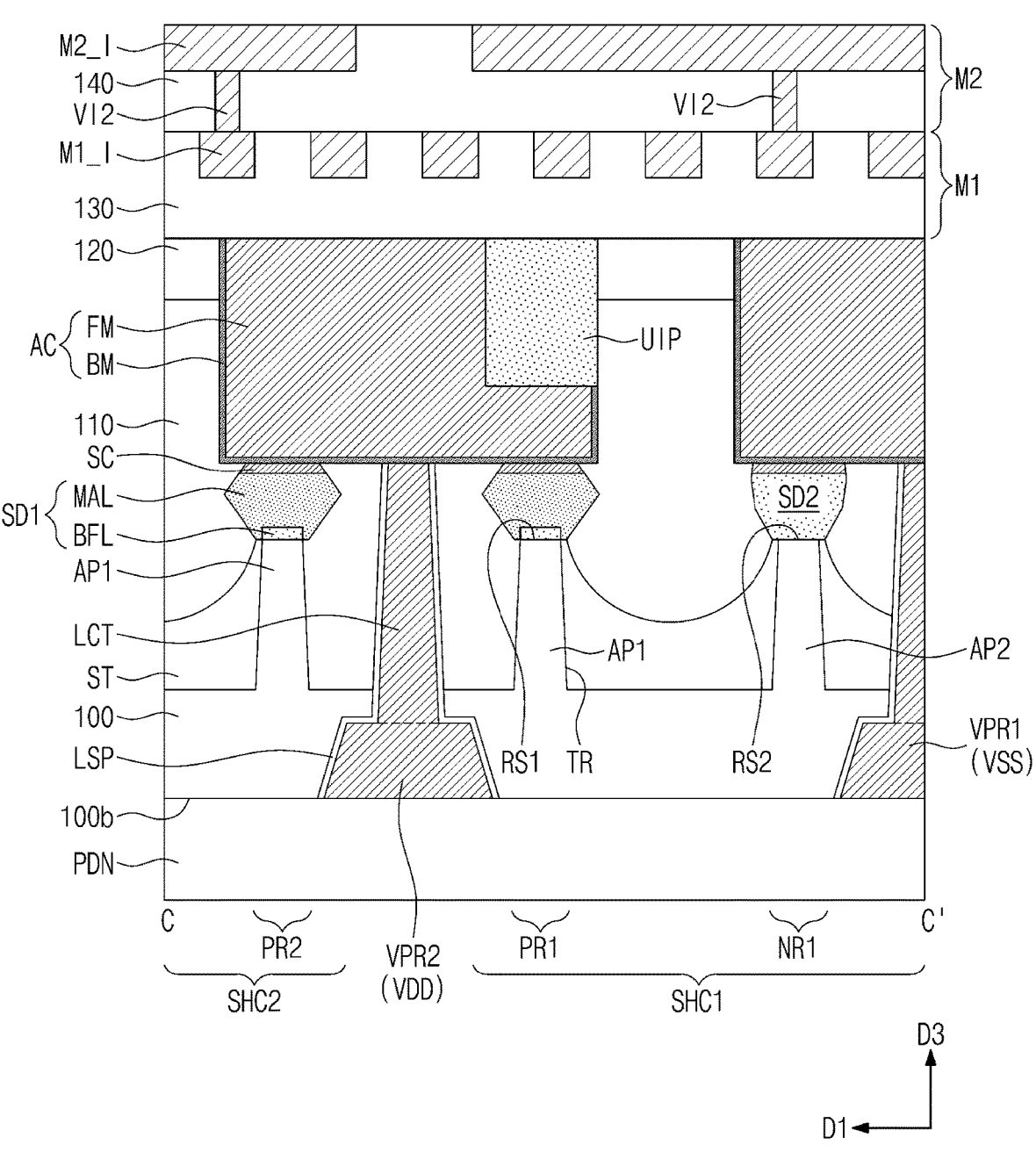
Figure 5D:
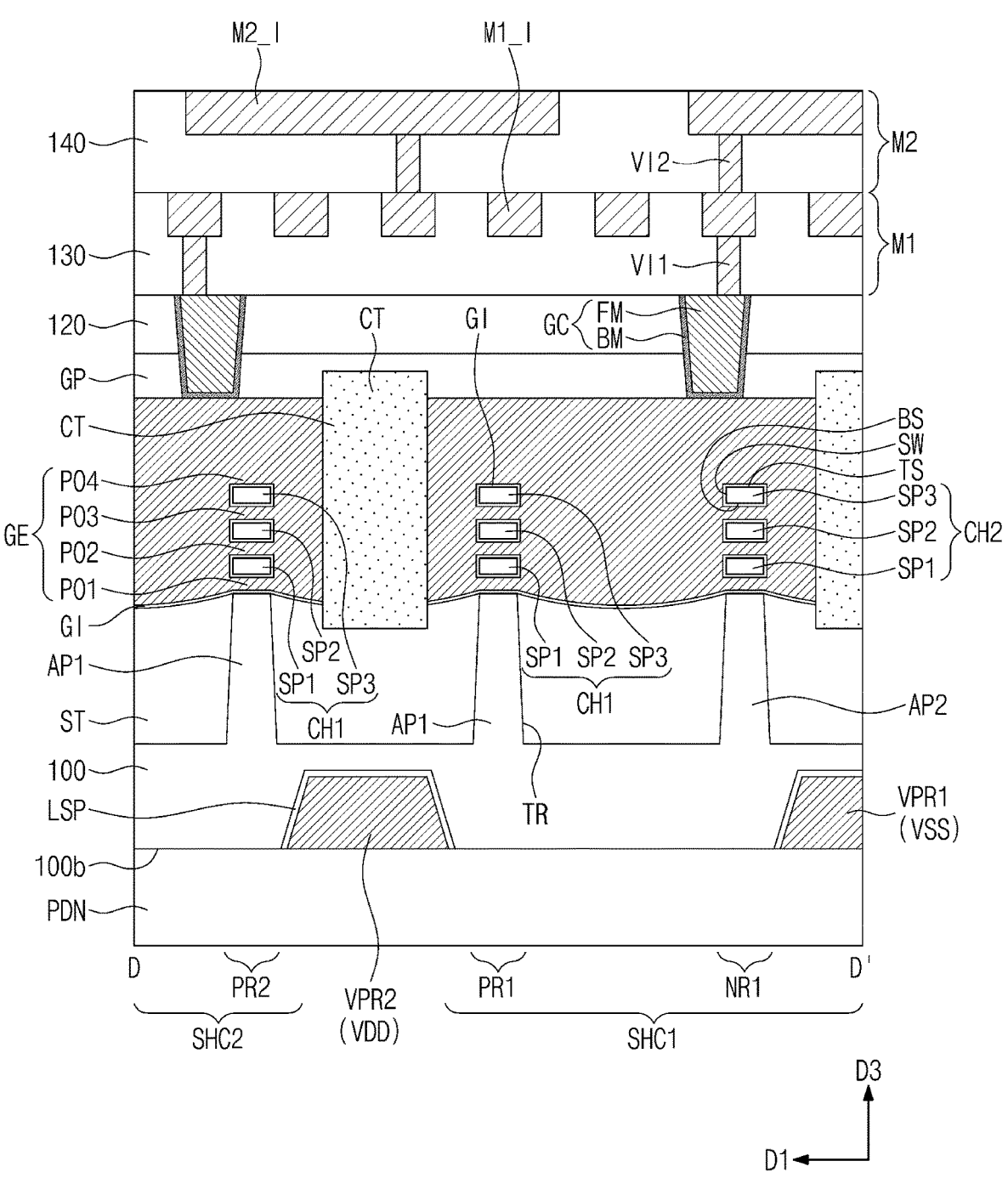

In an embodiment, referring to FIGS. 5A and 5C, an upper portion of the active contact AC adjacent to the gate contact GC may be filled with an upper insulating pattern UIP. A bottom surface of the upper insulating pattern UIP may be lower than a bottom surface of the gate contact GC. In other words, a top surface of the active contact AC adjacent to the gate contact GC may be formed at a level, which is lower than the bottom surface of the gate contact GC, by the upper insulating pattern UIP. Accordingly, it may be possible to prevent the gate contact GC and the active contact AC, which are adjacent to each other, from being in contact with each other and thereby to prevent a short circuit issue from occurring therebetween.

Each of the active and gate contacts AC and GC may include a conductive pattern FM and a barrier pattern BM surrounding the conductive pattern FM. For example, the conductive pattern FM may be formed of or include at least one of metallic materials (e.g., aluminum, copper, tungsten, molybdenum, and cobalt). The barrier pattern BM may be provided to cover side and bottom surfaces of the conductive pattern FM. For example, the barrier pattern BM may contact side and bottom surfaces of the conductive pattern FM. In an embodiment, the barrier pattern BM may include a metal layer and a metal nitride layer. The metal layer may be formed of or include at least one of titanium, tantalum, tungsten, nickel, cobalt, or platinum. The metal nitride layer may be formed of or include at least one of titanium nitride (TiN), tantalum nitride (TaN), tungsten nitride (WN), nickel nitride (NiN), cobalt nitride (CoN), or platinum nitride (PtN).

Referring back to FIGS. 4, 5C, and 5D, the first to third lower power lines VPR1, VPR2, and VPR3 may be provided in a lower portion of the substrate 100. The first to third lower power lines VPR1, VPR2, and VPR3 may extend lengthwise in the second direction D2 to be parallel to each other. The first lower power line VPR1 may be disposed on the fourth border BD4 of the first single height cell SHC1. The second lower power line VPR2 may be disposed on the third border BD3 of the first single height cell SHC1. In other words, the first single height cell SHC1 may be defined between the first lower power line VPR1 and the second lower power line VPR2. The second single height cell SHC2 may be defined between the second lower power line VPR2 and the third lower power line VPR3.

Referring back to FIG. 5C, the second lower power line VPR2 may be electrically connected to at least one of the active contacts AC. A lower contact LCT may be provided on the second lower power line VPR2. The lower contact LCT may be vertically extended from the second lower power line VPR2 to the active contact AC to penetrate the substrate 100, the device isolation layer ST, and the first interlayer insulating layer 110. For example, the lower contact LCT may contact the active contact AC. The lower contact LCT may electrically connect the second lower power line VPR2 to the active contact AC. As a result, in the semiconductor device according to the present embodiment, the lower power lines VPR1 to VPR3 may be electrically connected to the source/drain patterns SD1 and SD2 through the lower contact LCT and the active contact AC.

A lower spacer LSP may be interposed between the lower power lines VPR1, VPR2, or VPR3 and the substrate 100 and between the lower contact LCT and the substrate 100. For example, the lower spacer LSP may contact the lower power lines VPR1, VPR2, and VPR3. The lower spacer LSP may be formed of or include at least one of silicon-based insulating materials (e.g., silicon oxide, silicon nitride, or silicon oxynitride). The lower power line VPR1, VPR2, or VPR3 may be electrically disconnected from the substrate 100 by the lower spacer LSP.

In an embodiment, a bottom surface of the lower power line VPR1, VPR2, or VPR3 may be coplanar with a bottom surface 100b of the substrate 100. A power delivery network layer PDN may be provided on the bottom surface 100b of the substrate 100. In another embodiment, the lower power line VPR1, VPR2, or VPR3 may be provided in the power delivery network layer PDN.

The power delivery network layer PDN may include a plurality of lower interconnection lines, which are electrically connected to the first to third lower power lines VPR1, VPR2, and VPR3. As an example, the power delivery network layer PDN may include a wiring network, which is used to apply the source voltage VSS to the first and third lower power lines VPR1 and VPR3. The power delivery network layer PDN may include a wiring network, which is used to apply the drain voltage VDD to the second lower power line VPR2.

A first metal layer M1 may be provided in the third interlayer insulating layer 130. The first metal layer M1 may include first interconnection lines M1_I. The first interconnection lines M1_I of the first metal layer M1 may extend lengthwise in the second direction D2 to be parallel to each other.

According to an embodiment of the inventive concept, a power line, which is used to supply an electric power to the single height cell SHC, may be provided in a lower portion of the substrate 100, and at least one of the lower power lines VPR1 to VPR3 may be used as the power line. Thus, the power line may be omitted from the first metal layer M1. The first interconnection lines M1_I, which are used for signal transmission, may be disposed in the first metal layer M1. The first interconnection lines M1_I may be arranged at a second pitch in the first direction D1. The second pitch may be smaller than the first pitch.

The first metal layer M1 may further include first vias VI1. The first vias VI1 may be respectively provided below the first interconnection lines M1_I of the first metal layer M1. And the first interconnection line M1_I of the first metal layer M1 may be electrically connected to the active contact AC through the first via VI1. The first interconnection line M1_I of the first metal layer M1 may be electrically connected to the gate contact GC through the first via VI1.

The first interconnection line M1_I of the first metal layer M1 and the first via VI1 thereunder may be separately formed by different processes. For example, each of the first interconnection line M1_I and the first via VI1 of the first metal layer M1 may be formed by a single damascene process. The semiconductor device according to the present embodiment may be fabricated using a sub-20 nm process.

A second metal layer M2 may be provided in a fourth interlayer insulating layer 140. The second metal layer M2 may include a plurality of second interconnection lines M2_I. Each of the second interconnection lines M2_I of the second metal layer M2 may be a line- or bar-shaped pattern that is extended in the first direction D1. In other words, the second interconnection lines M2_I may extend lengthwise in the first direction D1 to be parallel to each other.

The second metal layer M2 may further include second vias VI2, which are respectively provided below the second interconnection lines M2_I. The first interconnection line M1_I of the first metal layer M1 and the second interconnection line M2_I of the second metal layer M2 may be electrically connected to each other through the second via VI2. As an example, the second interconnection line M2_I of the second metal layer M2 and the second via VI2 thereunder may be formed by a dual damascene process.

The first interconnection line M1_I of the first metal layer M1 and the second interconnection line M2_I of the second metal layer M2 may be formed of or include the same conductive material or different conductive materials. For example, the first interconnection line M1_I of the first metal layer M1 and the second interconnection line M2_I of the second metal layer M2 may be formed of or include at least one of metallic materials (e.g., aluminum, copper, tungsten, molybdenum, ruthenium, and cobalt). Although not shown, a plurality of metal layers (e.g., M3, M4, M5, and so forth) may be additionally stacked on the fourth interlayer insulating layer 140. Each of the stacked metal layers may include interconnection lines, which are used as routing paths between cells.

In a semiconductor device according to an embodiment of the inventive concept, the lower power lines VPR1, VPR2, and VPR3 and the power delivery network layer PDN may be provided in a lower portion of the substrate 100. Thus, it may be possible to effectively reduce a thickness of the substrate 100. In an embodiment, the bottom surface 100b of the substrate 100 may be formed by a wafer backside CMP process.

Figure 6:
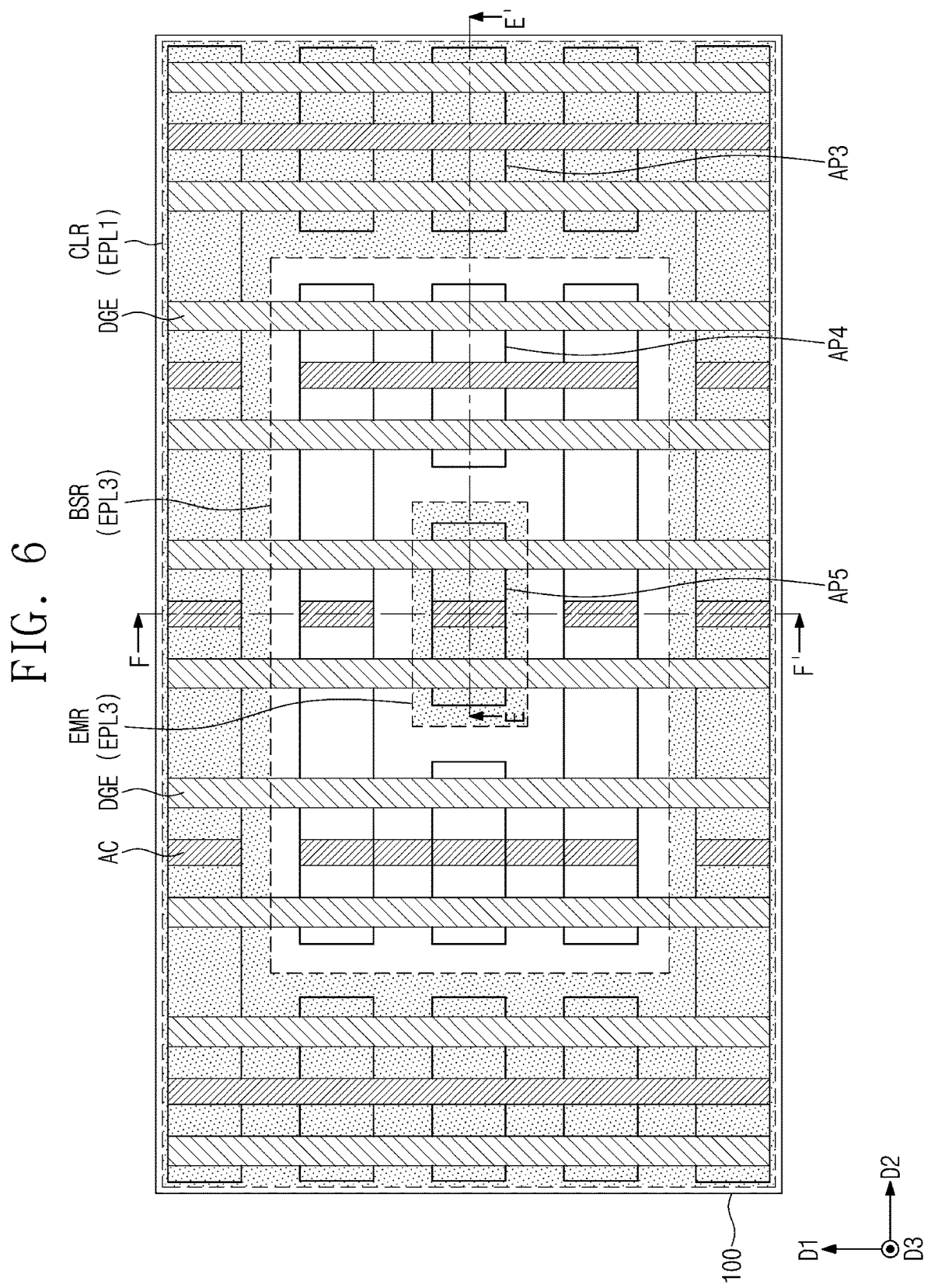
FIG. 6 is a plan view illustrating a semiconductor device, according to an example embodiment of the inventive concept.
Figure 7A:
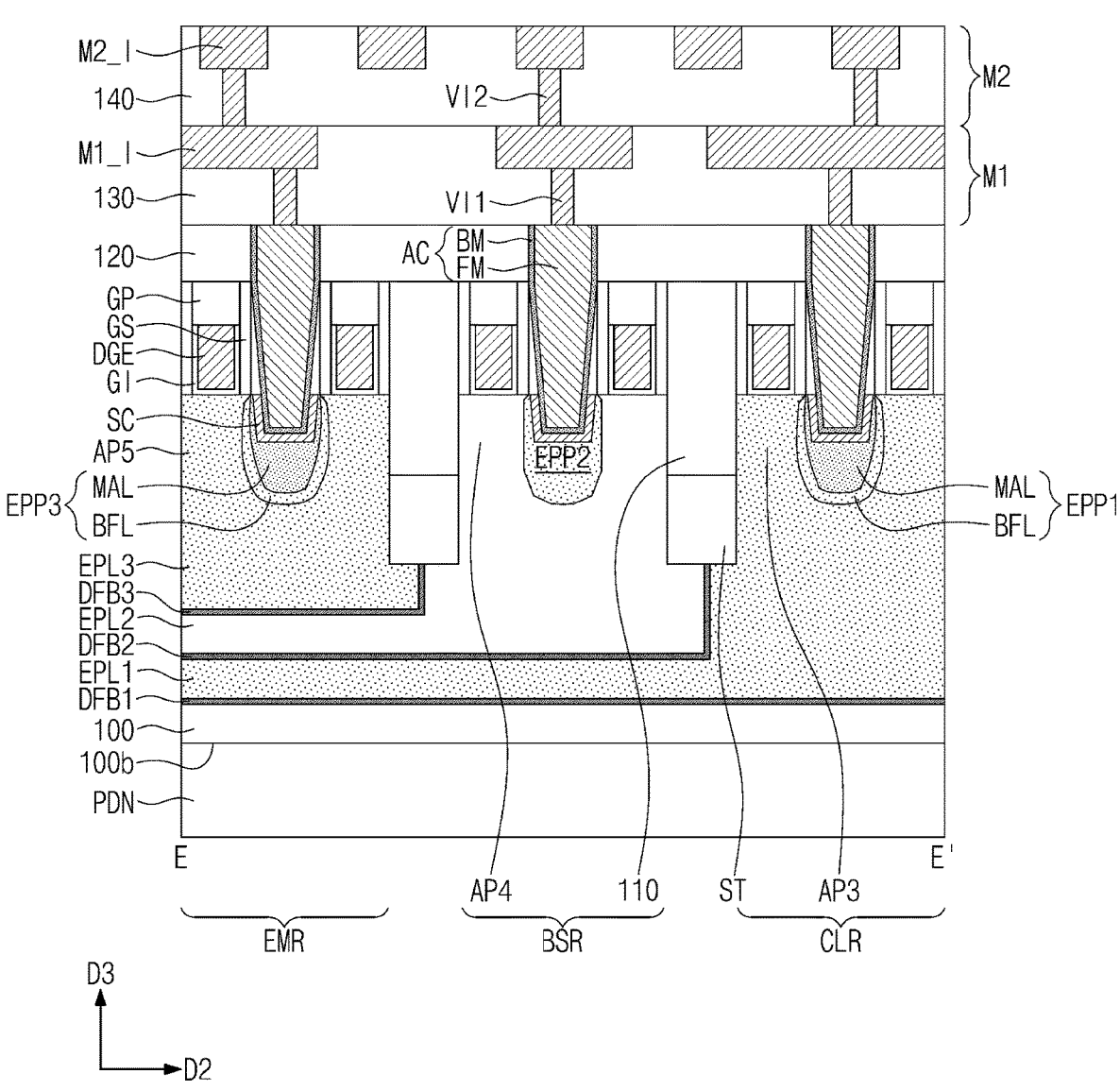
FIGS. 7A and 7B are sectional views taken along lines E-E' and F-F' of FIG. 6, respectively.
Figure 7B:
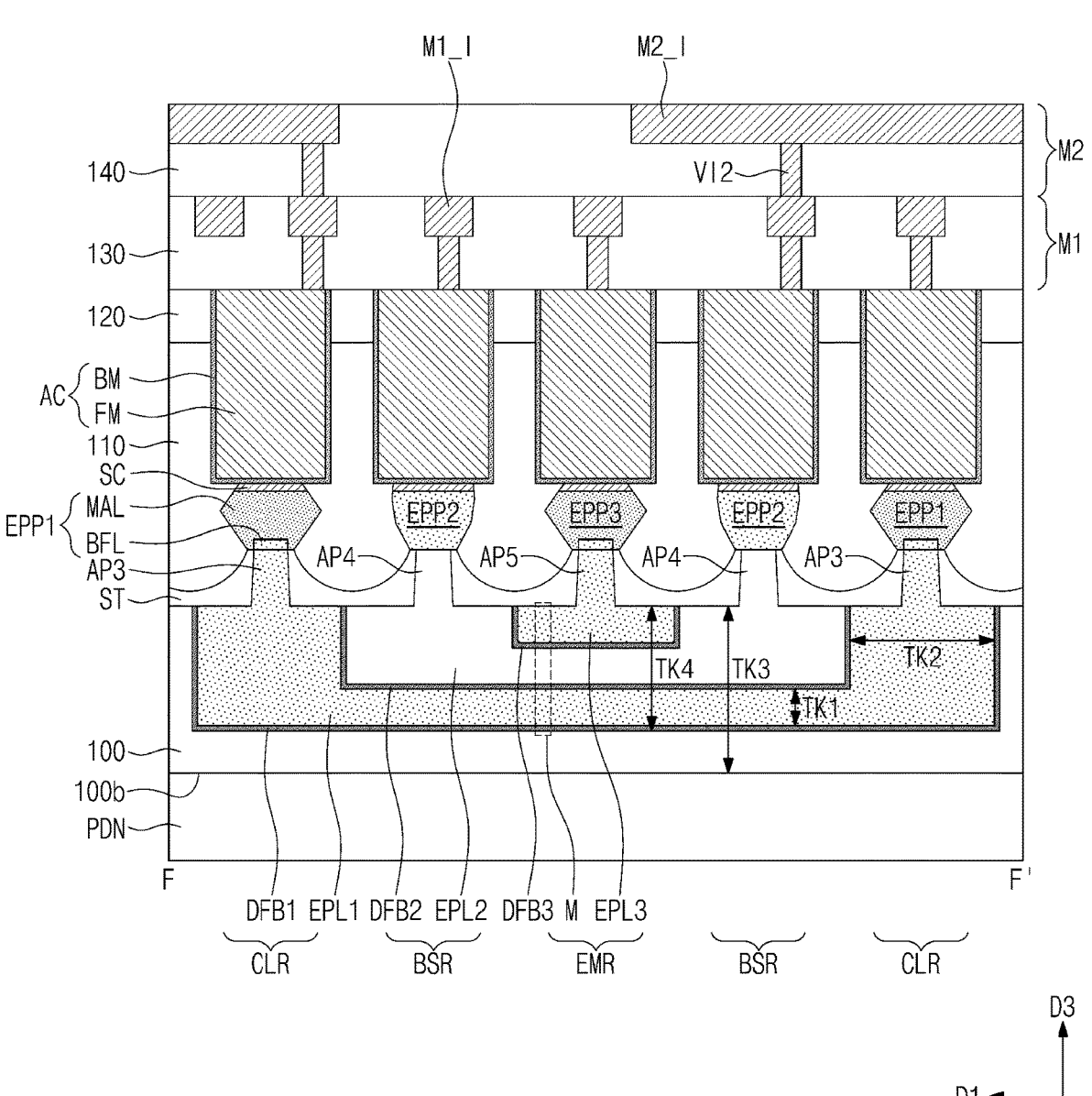

FIG. 6 is a plan view illustrating a semiconductor device according to an example embodiment of the inventive concept. FIGS. 7A and 7B are sectional views taken along lines E-E' and F-F' of FIG. 6, respectively. FIGS. 6, 7A, and 7B illustrate an example of a region that is different from a logic cell block, in which the first and second single height cells SHC1 and SHC2 described above are provided. The structure shown in FIGS. 6, 7A, and 7B may be provided in a core/peri region or an I/O region. For example, the structure illustrated in FIGS. 4, 5A, and 5B may be provided in a logic cell block of the semiconductor device, and the structure illustrated in FIGS. 6, 7A, and 7B may be provided in the core/peri region or the I/O region of the same semiconductor device. In the following description, an element previously described with reference to FIG. 4 and FIGS. 5A to 5D may be identified by the same reference number without repeating an overlapping description thereof, for concise description.

Referring to FIGS. 6, 7A, and 7B, an emitter region EMR, a base region BSR, and a collector region CLR may be provided in the substrate 100. When viewed in a plan view, the emitter region EMR may have an island shape. The base region BSR may have a doughnut shape enclosing the emitter region EMR. The collector region CLR may have a doughnut shape enclosing the base region BSR.

The emitter region EMR may include a third epitaxial layer EPL3. The third epitaxial layer EPL3 may be an epitaxial semiconductor layer having the first conductivity type (e.g., p-type). The base region BSR may include a second epitaxial layer EPL2. The second epitaxial layer EPL2 may be an epitaxial semiconductor layer having the second conductivity type (e.g., n-type). The collector region CLR may include a first epitaxial layer EPL1. The first epitaxial layer EPL1 may be an epitaxial semiconductor layer having the first conductivity type (e.g., p-type).

A first diffusion prevention layer DFB1 may be provided between the substrate 100 and the first epitaxial layer EPL1. A second diffusion prevention layer DFB2 may be provided between the first epitaxial layer EPL1 and the second epitaxial layer EPL2. A third diffusion prevention layer DFB3 may be provided between the second epitaxial layer EPL2 and the third epitaxial layer EPL3.

The first diffusion prevention layer DFB1 may be configured to prevent an impurity (e.g., boron (B)) in the first epitaxial layer EPL1 from being diffused into the substrate 100. The first diffusion prevention layer DFB1 may be a SiC-containing epitaxial layer. The first diffusion prevention layer DFB1 may further include an impurity (e.g., B) diffused from the first epitaxial layer EPL1.

The second diffusion prevention layer DFB2 may be configured to prevent an impurity (e.g., phosphorus (P)) in the second epitaxial layer EPL2 from being diffused into the first epitaxial layer EPL1. The second diffusion prevention layer DFB2 may be an epitaxial layer containing SiAs, SiC, or SiAsC. The second diffusion prevention layer DFB2 may further include an impurity (e.g., P) diffused from the second epitaxial layer EPL2.

The third diffusion prevention layer DFB3 may be configured to prevent an impurity (e.g., phosphorus (P)) in the second epitaxial layer EPL2 from being diffused into the third epitaxial layer EPL3. The third diffusion prevention layer DFB3 may be formed of or include the same material as the second diffusion prevention layer DFB2.

The first epitaxial layer EPL1 and the second epitaxial layer EPL2 thereon may form a PN junction. The second epitaxial layer EPL2 and the third epitaxial layer EPL3 thereon may form an NP junction. That is, the first to third epitaxial layers EPL1 to EPL3, which are sequentially stacked, may constitute a vertical PNP junction. The first to third epitaxial layers EPL1 to EPL3, which are sequentially stacked, may constitute a vertical bipolar junction transistor.

In an embodiment, a first thickness TK1 of each of the first and second epitaxial layers EPL1 and EPL2 in a vertical direction may be smaller than a second thickness TK2 of each of the first and second epitaxial layers EPL1 and EPL2 in the horizontal direction. Alternatively, in each of the first and second epitaxial layers EPL1 and EPL2, the first thickness TK1 may be substantially equal to the second thickness TK2.

In an embodiment, a vertical thickness of each of the first and third epitaxial layers EPL1 and EPL3 may range from 50 nm to 200 nm. A vertical thickness of the second epitaxial layer EPL2 may range from 100 nm to 400 nm. A thickness of each of the first to third diffusion prevention layers DFB1, DFB2, and DFB3 may range from 5 nm to 20 nm. For example, a total vertical thickness TK4 of the first to third epitaxial layers EPL1 to EPL3 may be about 300 nm. The total vertical thickness TK4 may be smaller than a thickness TK3 of the substrate 100.

Since, as described above, the semiconductor device according to an embodiment of the inventive concept includes the power delivery network layer PDN, it may be necessary to reduce the thickness TK3 of the substrate 100. If the thickness TK3 of the substrate 100 is not reduced, there may be a difficulty in forming the lower contact LCT described with reference to FIG. 5C. According to the present embodiment, the epitaxial layer EPL1, EPL2, or EPL3 constituting the vertical bipolar junction transistor may be provided to have a small vertical thickness (e.g., TK1). Thus, in comparison to a vertical bipolar junction transistor realized using a well formed in the substrate 100 using a doping process, the vertical bipolar junction transistor according to an embodiment of the inventive concept may be easily formed in the substrate 100 having a small thickness.

A fifth active pattern AP5 may be provided on the emitter region EMR. Fourth active patterns AP4 may be provided on the base region BSR. Third active patterns AP3 may be provided on the collector region CLR. The device isolation layer ST provided on the substrate 100 may define the third to fifth active patterns AP3 to AP5. Each of the third to fifth active patterns AP3 to AP5 may have a fin shape vertically protruding above the device isolation layer ST.

The fifth active patterns AP5 may be a portion of the third epitaxial layer EPL3. For example, the fifth active patterns AP5 may be part of the third epitaxial layer EPL3 (e.g., formed by etching the third epitaxial layer EPL3) or may be formed on the third epitaxial layer EPL3 (e.g., an epitaxial layer grown from the third epitaxial layer EPL3). Thus, the fifth active patterns AP5 may have the first conductivity type. The fourth active patterns AP4 may be a portion of the second epitaxial layer EPL2. For example, the fourth active patterns AP4 may be part of the second epitaxial layer EPL2 (e.g., formed by etching the second epitaxial layer EPL2) or may be formed on the second epitaxial layer EPL2 (e.g., an epitaxial layer grown from the second epitaxial layer EPL2). Thus, the fourth active patterns AP4 may have the second conductivity type. The third active pattern AP3 may be a portion of the first epitaxial layer EPL1. For example, the third active pattern AP3 may be part of the first epitaxial layer EPL1 (e.g., formed by etching the first epitaxial layer EPL1) or may be formed on the first epitaxial layer EPL1 (e.g., an epitaxial layer grown from the first epitaxial layer EPL1). Thus, the third active pattern AP3 may have the first conductivity type.

A third epitaxial pattern EPP3 may be provided on the fifth active pattern AP5. The third epitaxial pattern EPP3 may have a structure that is the same as the first source/drain pattern SD1 described above. For example, the third epitaxial pattern EPP3 may include the buffer layer BFL and the main layer MAL. The third epitaxial pattern EPP3 may be formed of or include silicon-germanium (SiGe). The third epitaxial pattern EPP3 may have the first conductivity type. The third epitaxial pattern EPP3 may be directly connected to the third epitaxial layer EPL3.

A second epitaxial pattern EPP2 may be provided on the fourth active pattern AP4. The second epitaxial pattern EPP2 may have a structure that is the same as the second source/drain pattern SD2 described above. For example, the second epitaxial pattern EPP2 may be formed of or include silicon (Si). The second epitaxial pattern EPP2 may have the second conductivity type. The second epitaxial pattern EPP2 may be directly connected to the second epitaxial layer EPL2.

A first epitaxial pattern EPP1 may be provided on the third active pattern AP3. The first epitaxial pattern EPP1 may be the same as the third epitaxial pattern EPP3 described above. For example, the third epitaxial pattern EPP3 may include the buffer layer BFL and the main layer MAL. The first epitaxial pattern EPP1 may have the first conductivity type. The first epitaxial pattern EPP1 may be directly connected to the first epitaxial layer EPL1.

Dummy electrodes DGE may be provided on the substrate 100. The dummy electrodes DGE may extend lengthwise in the first direction D1 to be parallel to each other. The dummy electrodes DGE may cross the third to fifth active patterns AP3 to AP5.

The gate insulating layer GI may be provided between the dummy electrode DGE and the active patterns AP3 to AP5. The gate spacers GS may be provided on opposite side surfaces of the dummy electrode DGE, respectively. The gate capping pattern GP may be provided on a top surface of the dummy electrode DGE.

In an embodiment, the dummy electrode DGE may be formed concurrently with the formation of the gate electrode GE described above. Thus, the dummy electrode DGE may be formed of or include the same metallic material as the gate electrode GE.

The dummy electrodes DGE may be dummy patterns that are in an electrically-floated state. In an embodiment, the dummy electrodes DGE may be used to form the first to third epitaxial patterns EPP1 to EPP3.

The first interlayer insulating layer 110 may cover the gate spacers GS and the first to third epitaxial patterns EPP1 to EPP3. A top surface of the first interlayer insulating layer 110 may be coplanar with a top surface of the gate capping pattern GP formed on the dummy gate electrode DGE. The second interlayer insulating layer 120 may be provided on the first interlayer insulating layer 110. The third interlayer insulating layer 130 may be provided on the second interlayer insulating layer 120. The fourth interlayer insulating layer 140 may be provided on the third interlayer insulating layer 130.

The active contacts AC may be provided to penetrate the first and second interlayer insulating layers 110 and 120 and to be electrically connected to the first to third epitaxial patterns EPP1 to EPP3, respectively. When viewed in a plan view, the active contact AC may have a bar shape extending lengthwise in the first direction D1. In an embodiment, the active contact AC may include the conductive pattern FM and the barrier pattern BM surrounding the conductive pattern FM.

The first metal layer M1 may be provided in the third interlayer insulating layer 130. The second metal layer M2 may be provided in the fourth interlayer insulating layer 140. The first interconnection lines M1_I in the first metal layer M1 may be electrically connected to the active contacts AC, respectively, through the first vias VI1.

The third epitaxial layer EPL3, the fifth active pattern AP5 and the third epitaxial pattern EPP3 may constitute an emitter of the vertical bipolar junction transistor. The second epitaxial layer EPL2, the fourth active pattern AP4, and the second epitaxial pattern EPP2 may constitute a base of the vertical bipolar junction transistor. The first epitaxial layer EPL1, the third active pattern AP3, and the first epitaxial pattern EPP1 may constitute a collector of the vertical bipolar junction transistor.

According to an embodiment of the inventive concept, by using the first to third epitaxial layers EPL1 to EPL3, it may be possible to form the vertical bipolar junction transistor using a process of fabricating an MBCFET. Since the first to third epitaxial layers EPL1 to EPL3 have a relatively small vertical thickness TK1, the vertical bipolar junction transistor according to an embodiment of the inventive concept may have a structure compatible with an MBCFET having the power delivery network layer PDN.

Figure 8:
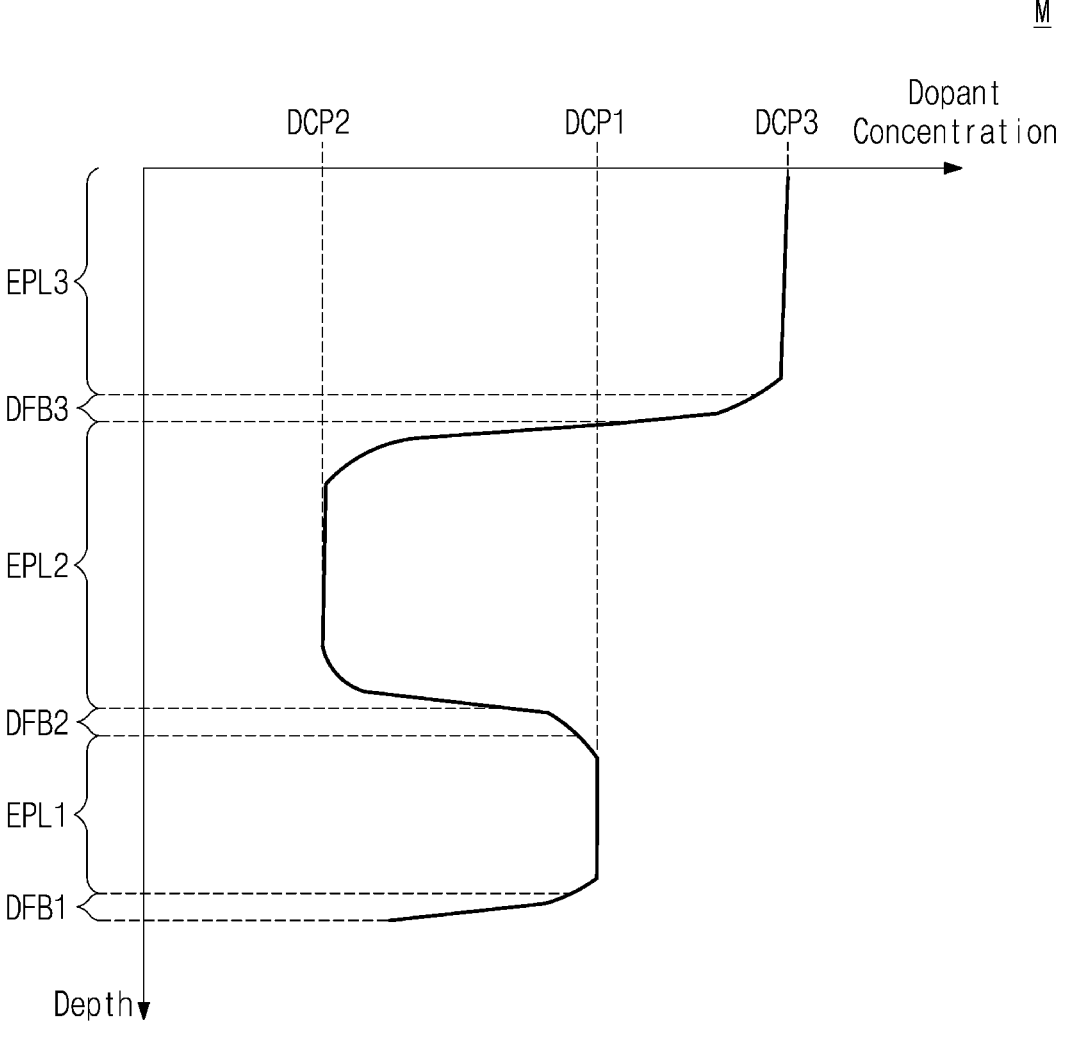
FIG. 8 is a graph showing an impurity concentration of a portion 'M' of FIG. 7B.

FIG. 8 is a graph showing an impurity concentration of a portion 'M' of FIG. 7B. Referring to FIG. 8, the first epitaxial layer EPL1 may contain boron (B) of a first impurity concentration DPC1. The second epitaxial layer EPL2 may contain phosphorus (P) of a second impurity concentration DPC2. The third epitaxial layer EPL3 may contain boron (B) of a third impurity concentration DPC3. The second impurity concentration DPC2 may be lower than the first impurity concentration DPC1. The third impurity concentration DPC3 may be higher than the first impurity concentration DPC1. In an embodiment, the first impurity concentration DPC1 may range from 1.0E19 to 1.0E20. The second impurity concentration DPC2 may range from 1.0E18 to 1.0E19. The third impurity concentration DPC3 may range from 1.0E20 to 1.0E21.

Near a boundary between the first epitaxial layer EPL1 and the second epitaxial layer EPL2 (i.e., the second diffusion prevention layer DFB2), the concentration may be abruptly changed from the first impurity concentration DPC1 to the second impurity concentration DPC2. For example, the second diffusion prevention layer DFB2 may clearly define a boundary region, which is defined between the first and second epitaxial layers EPL1 and EPL2 and has an abruptly-varying concentration.

Near a boundary between the second epitaxial layer EPL2 and the third epitaxial layer EPL3 (i.e., the third diffusion prevention layer DFB3), the concentration may be abruptly changed from the second impurity concentration DPC2 to the third impurity concentration DPC3. For example, the third diffusion prevention layer DFB3 may clearly define a boundary region, which is defined between the second and third epitaxial layers EPL2 and EPL3 and has an abruptly-varying concentration.

According to an embodiment of the inventive concept, the diffusion prevention layer DFB1 to DFB3 may prevent impurities in the epitaxial layers EPL1, EPL1, or EPL3 from being intermixed with impurities in a semiconductor layer adjacent thereto. Thus, it may be possible to improve electrical and reliability characteristics of the semiconductor device.

FIGS. 9A to 14B are sectional views illustrating a method of fabricating a semiconductor device, according to an example embodiment of the inventive concept. In detail, FIGS. 9A, 10A, 11A, 12A, 13A, and 14A are sectional views corresponding to the line E-E' of FIG. 6. FIGS. 9B, 10B, 11B, 12B, 13B, and 14B are sectional views corresponding to F-F' of FIG. 6.

Figure 9A:
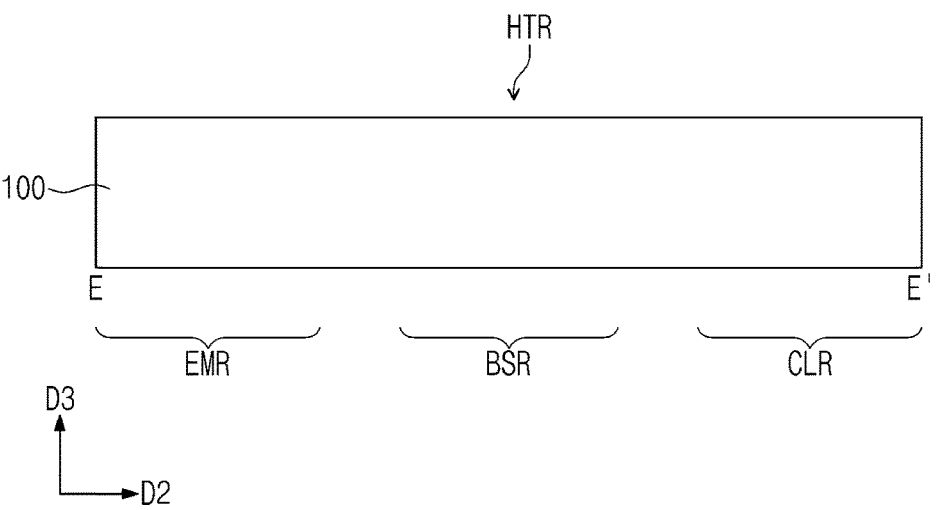
FIGS. 9A to 14B are sectional views illustrating a method of fabricating a semiconductor device, according to an example embodiment of the inventive concept.
Figure 9B:
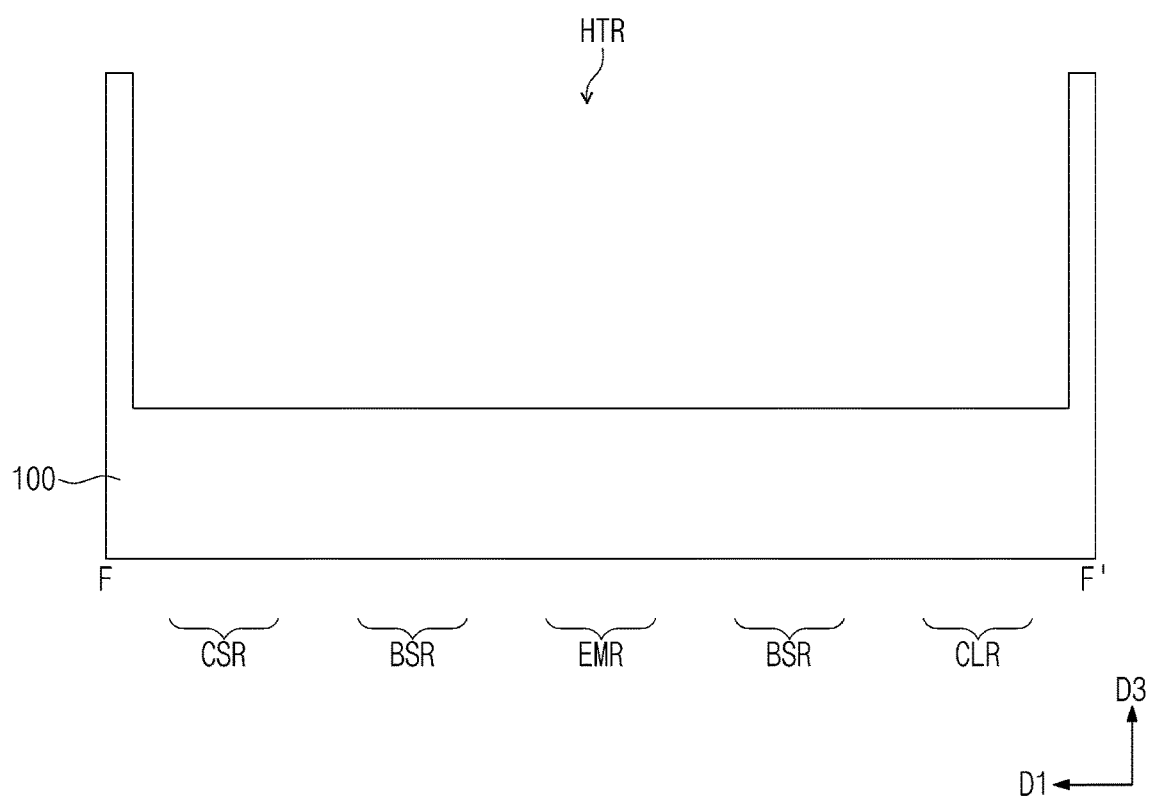

Referring to FIGS. 9A and 9B, the substrate 100 including the emitter region EMR, the base region BSR, and the collector region CLR may be provided. An anisotropic etching process may be performed on the emitter region EMR, the base region BSR, and the collector region CLR of the substrate 100 to form a depressed region HTR in an upper portion of the substrate 100. The depressed region HTR may be a crater-shaped region that is formed in an upper portion of the substrate 100.

Figure 10A:
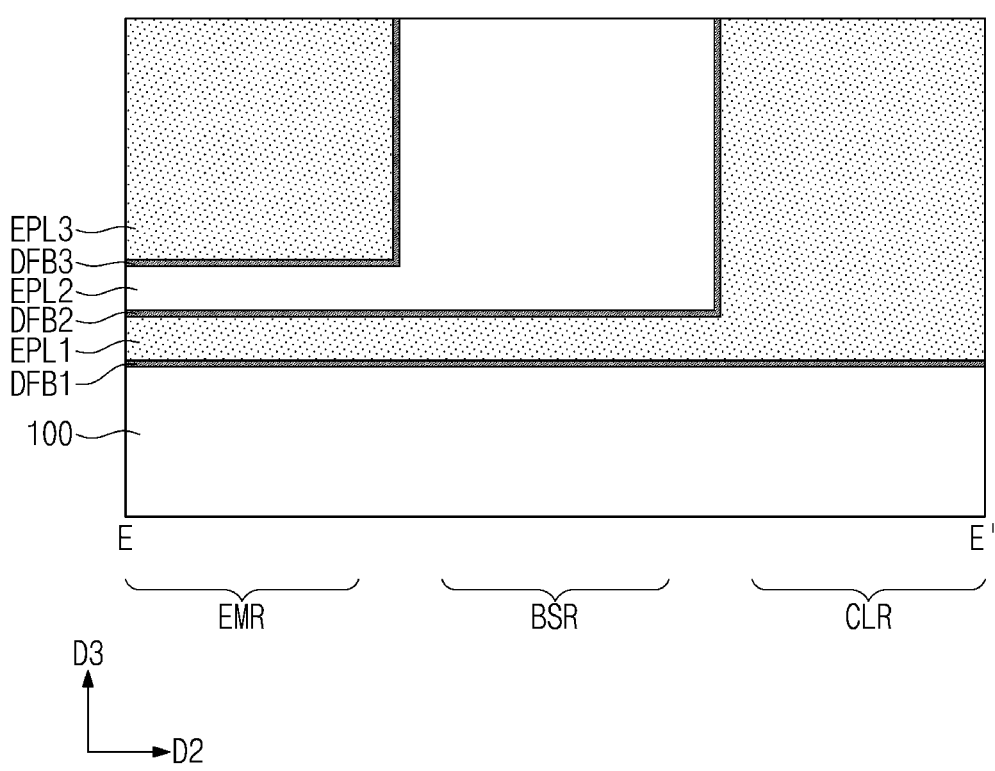
Figure 10B:
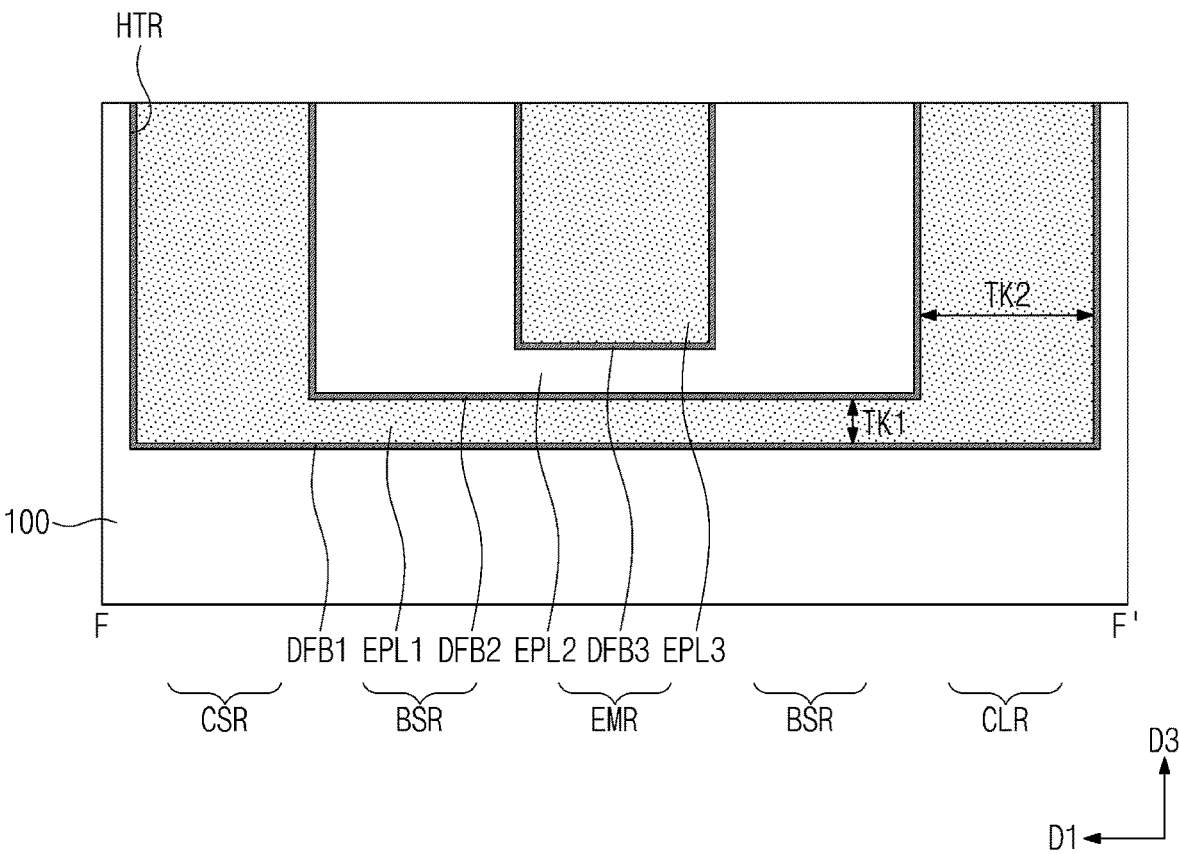

Referring to FIGS. 10A and 10B, the first to third epitaxial layers EPL1, EPL2, and EPL3 may be sequentially formed in the depressed region HTR of the substrate 100. In detail, a first epitaxial growth process may be performed on the depressed region HTR of the substrate 100 to form the first diffusion prevention layer DFB1. The first diffusion prevention layer DFB1 may have the same crystal structure as the substrate 100. The first diffusion prevention layer DFB1 may comprise silicon (Si) and a first diffusion prevention element. The first diffusion prevention element may be arsenic (As), carbon (C), or a combination thereof. A concentration of the first diffusion prevention element in the first diffusion prevention layer DFB1 may range from 1 at % to 20 at %. In an embodiment, the first diffusion prevention layer DFB1 may be formed using silicon carbide (SiC). The first diffusion prevention layer DFB1 may be formed to have a thickness from 5 nm to 20 nm. The first epitaxial growth process may include a chemical vapor deposition (CVD) process or a molecular beam epitaxy (MBE) process.

A second epitaxial growth process may be performed on the first diffusion prevention layer DFB1 to form the first epitaxial layer EPL1. The first epitaxial layer EPL1 may be formed using silicon (Si). First impurities (e.g., B) may be injected into the first epitaxial layer EPL1 in an in-situ manner during the formation of the first epitaxial layer EPL1. Thus, the first epitaxial layer EPL1 may have the first conductivity type (e.g., p-type).

In an embodiment, the first epitaxial layer EPL1 may be formed such that a vertical thickness TK1 thereof is smaller than a horizontal thickness TK2 thereof. The growth process of the first epitaxial layer EPL1 may be controlled such that a growth rate is less in a vertical direction than in a horizontal direction. For example, the vertical thickness TK1 may range from 50 nm to 200 nm.

A third epitaxial growth process may be performed on the first epitaxial layer EPL1 to form the second diffusion prevention layer DFB2. The second diffusion prevention layer DFB2 may comprise silicon (Si) and a second diffusion prevention element. The second diffusion prevention element may be arsenic (As), carbon (C), or a combination thereof. A concentration of the second diffusion prevention element in the second diffusion prevention layer DFB2 may range from 1 at % to 20 at %. For example, the second diffusion prevention layer DFB2 may be formed using SiAs, SiC, or SiAsC. The second diffusion prevention layer DFB2 may include a second diffusion prevention element that is different from the first diffusion prevention element included in the first diffusion prevention layer DFB1. For example, when the first diffusion prevention element of the first diffusion prevention layer DFB1 is carbon (C), the second diffusion prevention element of the second diffusion prevention layer DFB2 may be arsenic (As). The second diffusion prevention layer DFB2 may be formed to have a thickness from 5 nm to 20 nm.

A fourth epitaxial growth process may be performed on the second diffusion prevention layer DFB2 to form the second epitaxial layer EPL2. The second epitaxial layer EPL2 may be formed using silicon (Si). Second impurities (e.g., P) may be injected into the second epitaxial layer EPL2 in an in-situ manner during the formation of the second epitaxial layer EPL2. Thus, the second epitaxial layer EPL2 may have the second conductivity type (e.g., n-type). In an embodiment, the second epitaxial layer EPL2 may be formed such that its vertical thickness is smaller than its horizontal thickness. The second epitaxial layer EPL2 may be formed such that the vertical thickness thereof is larger than the vertical thickness of the first epitaxial layer EPL1.

A fifth epitaxial growth process may be performed on the second epitaxial layer EPL2 to form the third diffusion prevention layer DFB3. The third diffusion prevention layer DFB3 may comprise silicon (Si) and a third diffusion prevention element. The third diffusion prevention element may be arsenic (As), carbon (C), or a combination thereof. A concentration of the third diffusion prevention element in the third diffusion prevention layer DFB3 may range from 1 at % to 20 at %. The third diffusion prevention layer DFB3 may include a third diffusion prevention element that is different from the first diffusion prevention element included in the first diffusion prevention layer DFB1. For example, the third diffusion prevention layer DFB3 may be formed using SiAs, SiC, or SiAsC. The third diffusion prevention layer DFB3 may be formed to have a thickness from 5 nm to 20 nm.

A sixth epitaxial growth process may be performed on the third diffusion prevention layer DFB3 to form the third epitaxial layer EPL3. The third epitaxial layer EPL3 may be formed using silicon (Si). First impurities (e.g., B) may be injected into the third epitaxial layer EPL3 in an in-situ manner during the formation of the third epitaxial layer EPL3. Thus, the third epitaxial layer EPL3 may have the first conductivity type (e.g., p-type). The third epitaxial layer EPL3 may be formed to fully fill the depressed region HTR.

In an embodiment, after the formation of the first to third epitaxial layers EPL1, EPL2, and EPL3, a planarization process may be performed to expose the top surface of the substrate 100.

Figure 11A:
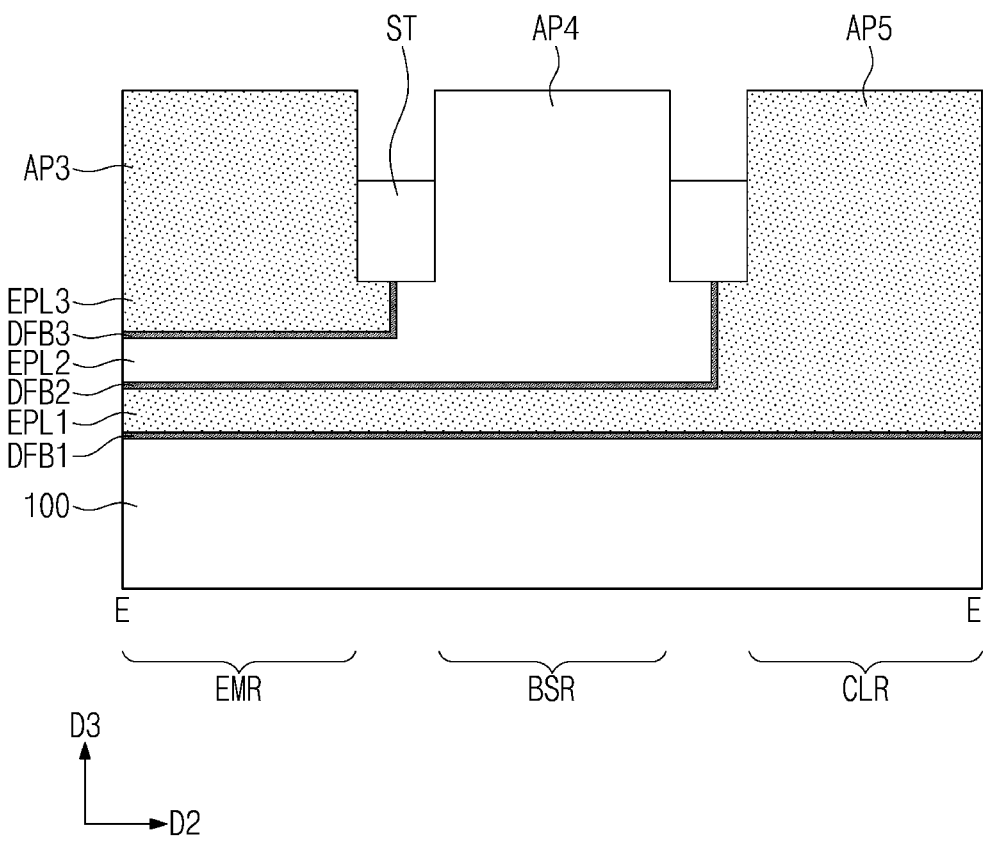
Figure 11B:
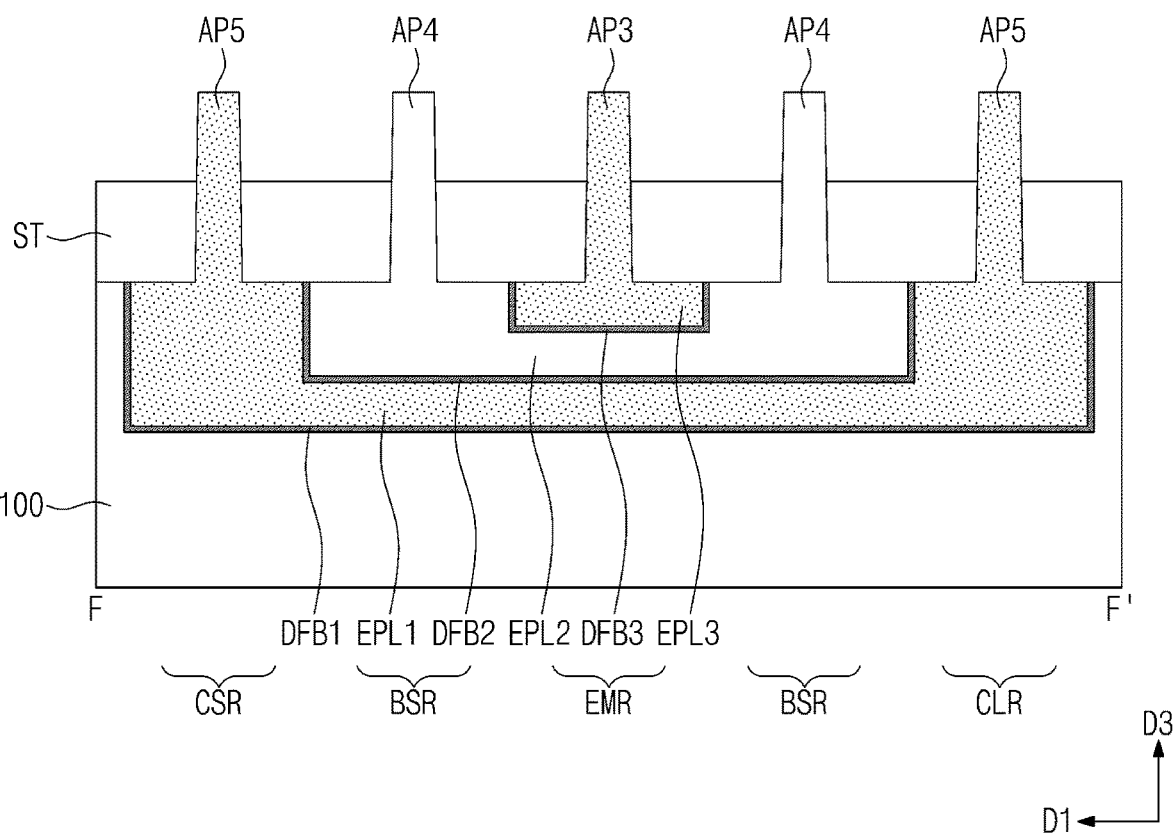

Referring to FIGS. 11A and 111B, the first to third epitaxial layers EPL1, EPL2, and EPL3 may be patterned to form the active patterns AP3 to AP5. In detail, the fifth active pattern AP5 may be formed in an upper portion of the third epitaxial layer EPL3 of the emitter region EMR. The fourth active pattern AP4 may be formed in an upper portion of the second epitaxial layer EPL2 of the base region BSR. The third active pattern AP3 may be formed in an upper portion of the first epitaxial layer EPL1 of the collector region CLR. Each of the active patterns AP3 to AP5 may be formed to have a fin shape extending in the second direction D2. Top surfaces of each of the active patterns AP3 to AP5 may be at the same vertical level.

As a result of the patterning process, a trench may be formed between the active patterns AP3 to AP5, which are adjacent to each other. The device isolation layer ST may be formed to fill the trench between the active patterns AP3 to AP5. An upper portion of each of the active patterns AP3 to AP5 may protrude above the device isolation layer ST.

Figure 12A:
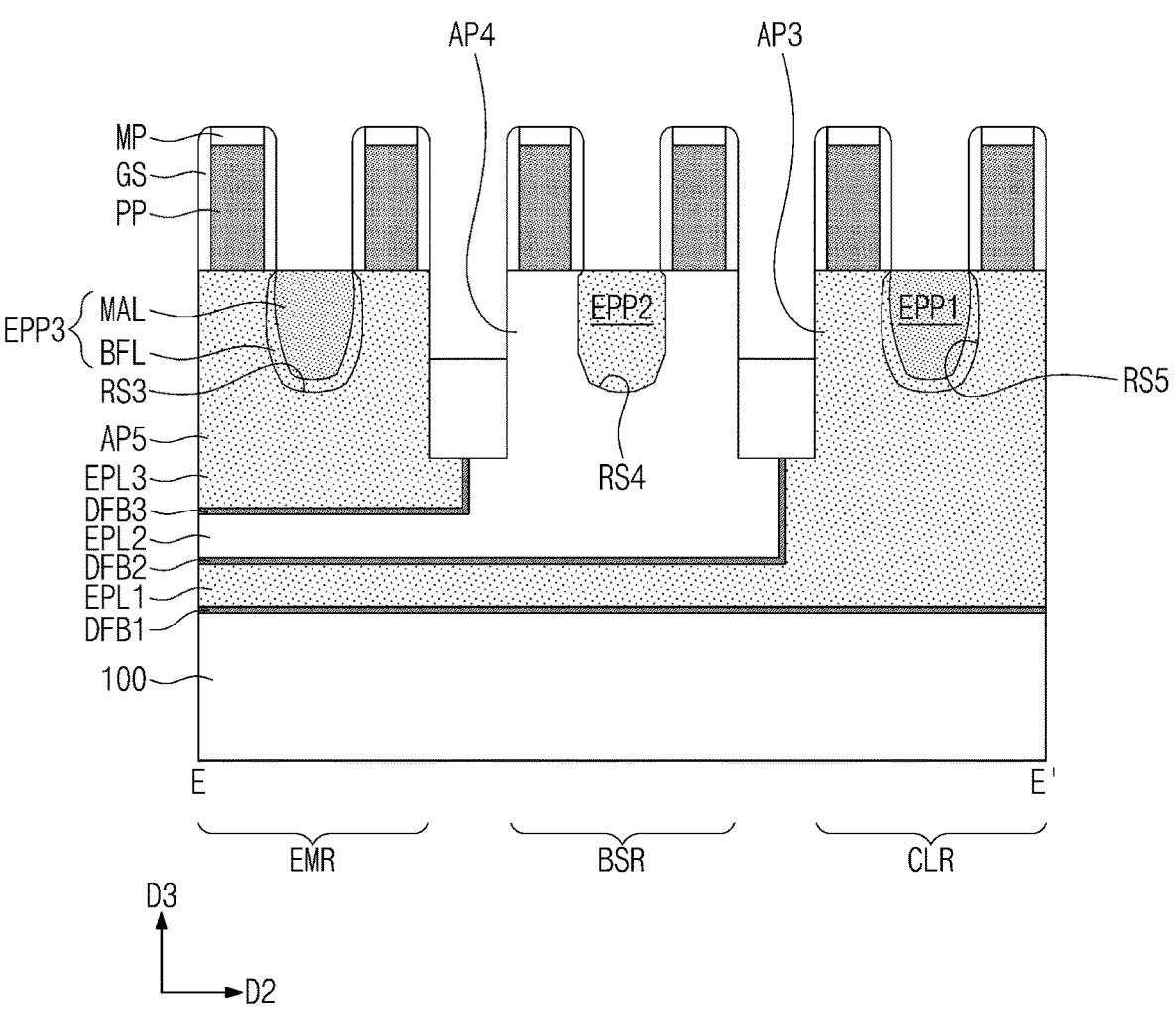
Figure 12B:
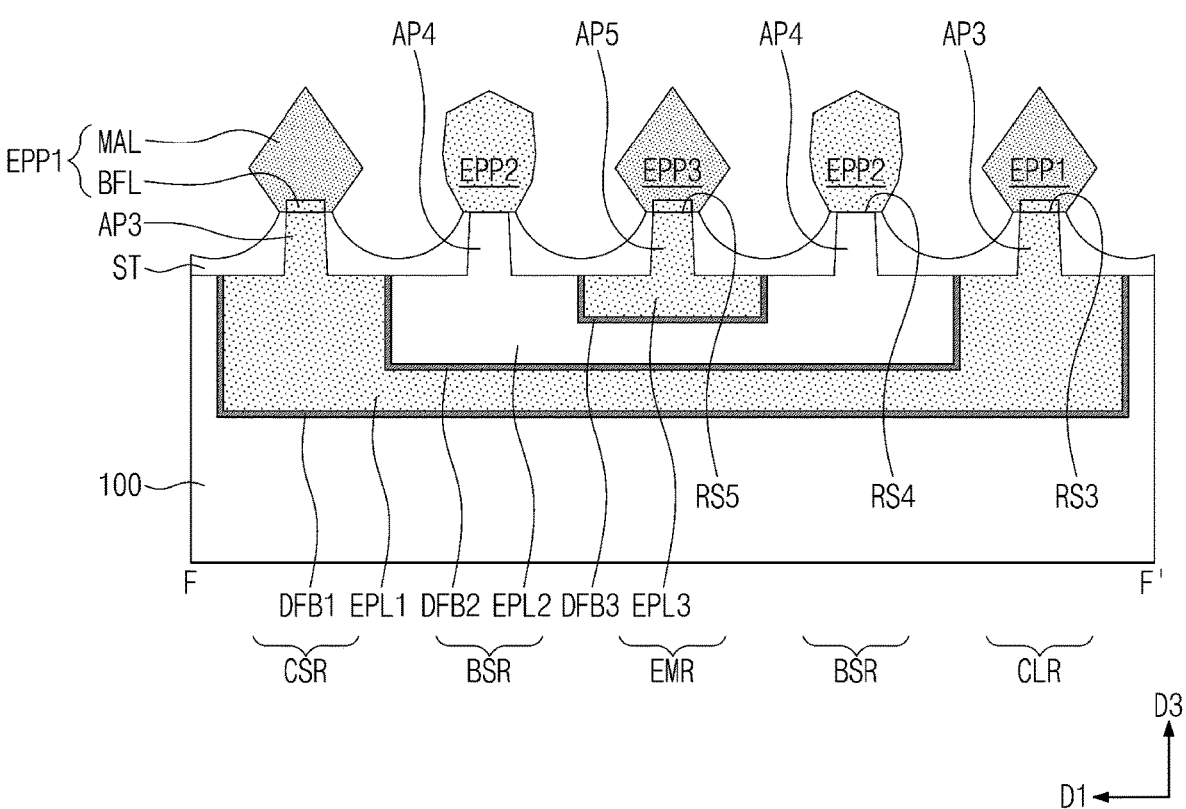

Referring to FIGS. 12A and 12B, sacrificial patterns PP may be formed on the substrate 100 to cross the active patterns AP3 to AP5. Each of the sacrificial patterns PP may be a line- or bar-shaped pattern extending in the first direction D1.

In detail, the formation of the sacrificial patterns PP may include forming a sacrificial layer on the substrate 100, forming hard mask patterns MP on the sacrificial layer, and patterning the sacrificial layer using the hard mask patterns MP as an etch mask. The sacrificial layer may be formed of or include polysilicon.

A pair of the gate spacers GS may be formed on opposite side surfaces of each of the sacrificial patterns PP. The formation of the gate spacers GS may include conformally forming a gate spacer layer on the substrate 100 and aniso-tropically etching the gate spacer layer. The gate spacer layer may be formed of or include at least one of SiCN, SiCON, or SiN.

Third to fifth recesses RS3 to RS5 may be formed in the third to fifth active patterns AP3 to AP5, respectively. During the formation of the third to fifth recesses RS3 to RS5, the device isolation layer ST may be further recessed (e.g., see FIG. 12B).

In detail, the third to fifth recesses RS3 to RS5 may be respectively formed by etching the third to fifth active patterns AP3 to AP5 using the hard mask patterns MP and the gate spacers GS as an etch mask. Each of the recesses RS3 to RS5 may be formed between a pair of the sacrificial patterns PP.

The third epitaxial pattern EPP3 may be formed in the third recess RS3. The third epitaxial pattern EPP3 may be formed by performing an epitaxial growth process, in which an inner surface of the third recess RS3 is used as a seed layer. In an embodiment, the third epitaxial pattern EPP3 may include the buffer layer BFL and the main layer MAL.

The buffer layer BFL may be formed on the third recess RS3. The buffer layer BFL may be formed of or include SiGe. The buffer layer BFL may contain a relatively low concentration of germanium (Ge). A germanium concentra-tion of the buffer layer BFL may range from 0 at % to 10 at %.

The main layer MAL may be formed on the buffer layer BFL. The main layer MAL may be formed to fill the third recess RS3. The main layer MAL may contain a relatively high concentration of germanium. In an embodiment, the germanium concentration of the main layer MAL may range from 30 at % to 70 at %. First impurities (e.g., B) may be injected into the third epitaxial pattern EPP3 in an in-situ manner during the formation of the buffer layer BFL and the main layer MAL.

The second epitaxial pattern EPP2 may be formed in the fourth recess RS4. In detail, the second epitaxial pattern EPP2 may be formed by performing an epitaxial growth process, in which an inner surface of the fourth recess RS4 is used as a seed layer. In an embodiment, the second epitaxial pattern EPP2 may be formed of or include Si. Second impurities (e.g., P) may be injected into the second epitaxial pattern EPP2 in an in-situ manner during the formation of the second epitaxial pattern EPP2.

The first epitaxial pattern EPP1 may be formed in the fifth recess RS5. In an embodiment, the first epitaxial pattern EPP1 may include the buffer layer BFL and the main layer MAL. The buffer layer BFL may be formed on the fifth recess RS5. The main layer MAL may be formed on the buffer layer BFL. The main layer MAL may be formed to fill the fifth recess RS5. The first epitaxial pattern EPP1 and the third epitaxial pattern EPP3 may be formed at the same time.

Figure 13A:
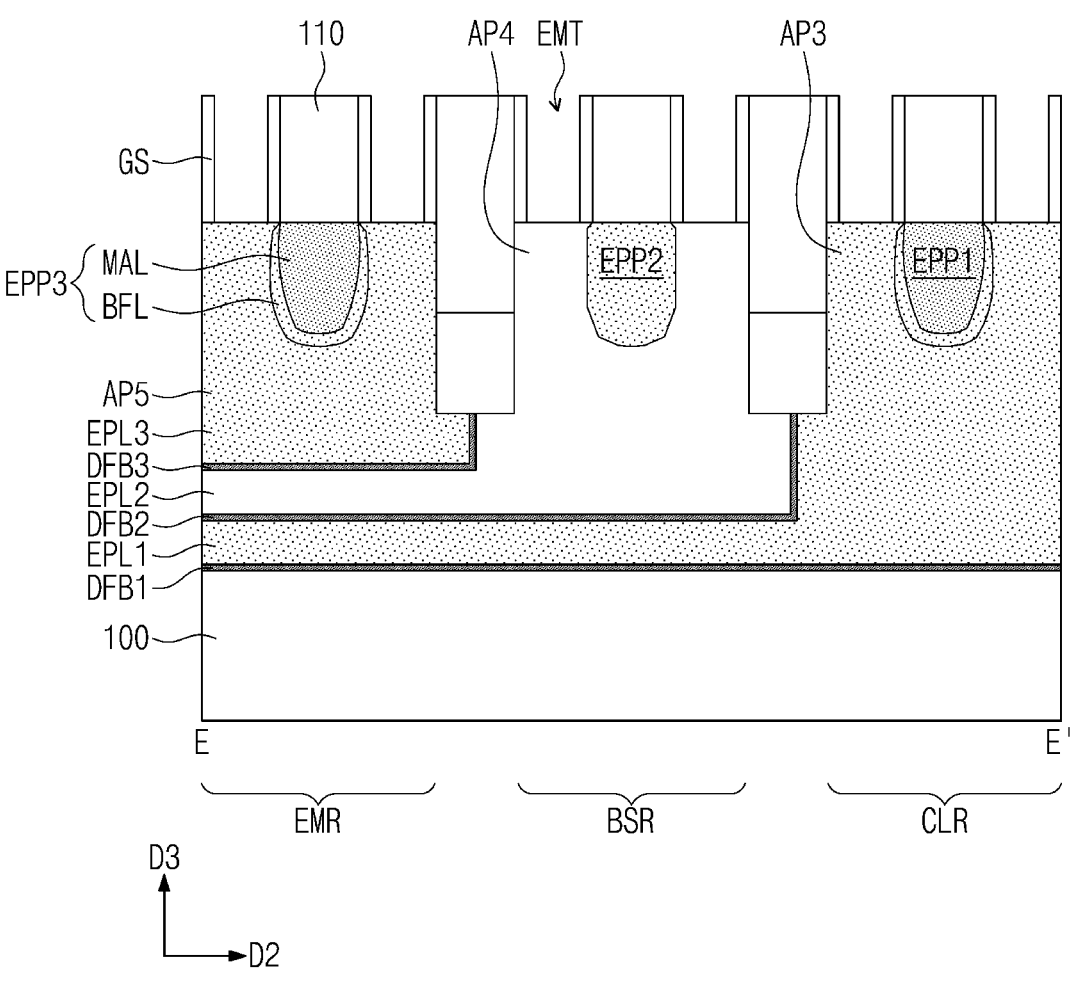
Figure 13B:
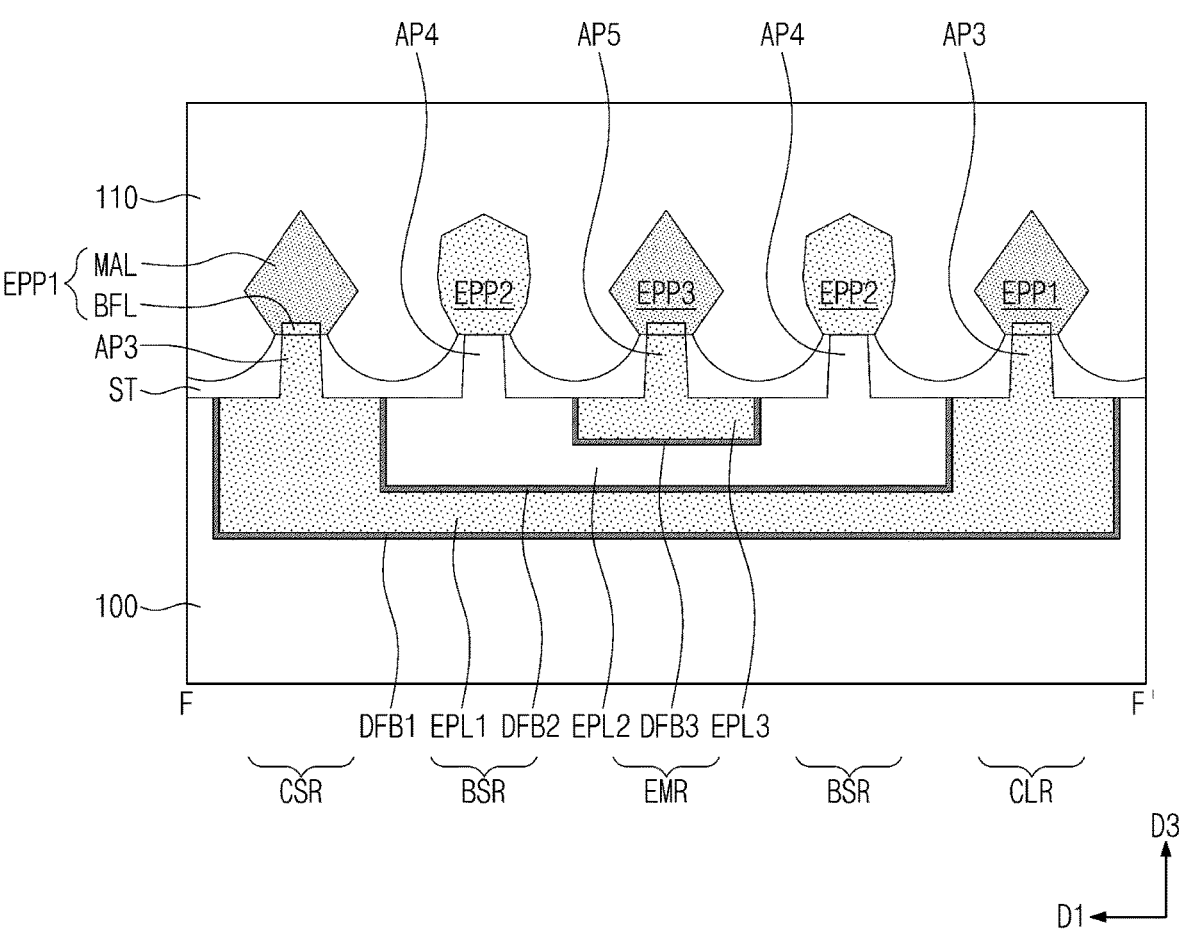

Referring to FIGS. 13A and 13B, the first interlayer insulating layer 110 may be formed to cover the first to third epitaxial patterns EPP1 to EPP3, the hard mask patterns MP, and the gate spacers GS. In an embodiment, the first inter-layer insulating layer 110 may include a silicon oxide layer.

The first interlayer insulating layer 110 may be planarized to expose the top surfaces of the sacrificial patterns PP. The planarization of the first interlayer insulating layer 110 may be performed using an etch-back or chemical-mechanical polishing (CMP) process. The hard mask patterns MP may be fully removed during the planarization process. As a result, a top surface of the first interlayer insulating layer 110 may be coplanar with the top surfaces of the sacrificial patterns PP and the top surfaces of the gate spacers GS.

In an embodiment, the exposed sacrificial patterns PP may be selectively removed. Since the sacrificial patterns PP are removed, an empty region EMT exposing the active patterns AP3 to AP5 may be formed (e.g., see FIG. 13A). The removal of the sacrificial patterns PP may include a wet etching process which is performed using an etching solu-tion capable of selectively etching polysilicon. The buffer layer BFL of the first and third epitaxial patterns EPP1 and EPP3 may prevent an etchant material, which is used to remove the sacrificial patterns PP, from entering and etching the main layer MAL of the first and third epitaxial patterns EPP1 and EPP3.

Referring back to FIGS. 7A and 7B, the gate insulating layer GI may be conformally formed in the empty region EMT. The dummy electrode DGE may be formed on the gate insulating layer GI. The dummy electrode DGE may be recessed to have a reduced height. The gate capping pattern GP may be formed on the recessed dummy electrode DGE.

The second interlayer insulating layer 120 may be formed on the first interlayer insulating layer 110. The second interlayer insulating layer 120 may include a silicon oxide layer. The active contacts AC may be formed to penetrate the second interlayer insulating layer 120 and the first interlayer insulating layer 110 and to be electrically connected to the first to third epitaxial patterns EPP1 to EPP3, respectively.

The formation of the active contact AC may include forming the barrier pattern BM and forming the conductive pattern FM on the barrier pattern BM. The barrier pattern BM may be conformally formed and may include a metal layer and/or a metal nitride layer. The conductive pattern FM may be formed of or include a low resistance metal.

The third interlayer insulating layer 130 may be formed on the active contacts AC. The first metal layer M1 may be formed in the third interlayer insulating layer 130. The fourth interlayer insulating layer 140 may be formed on the third interlayer insulating layer 130. The second metal layer M2 may be formed in the fourth interlayer insulating layer 140.

Figure 14A:
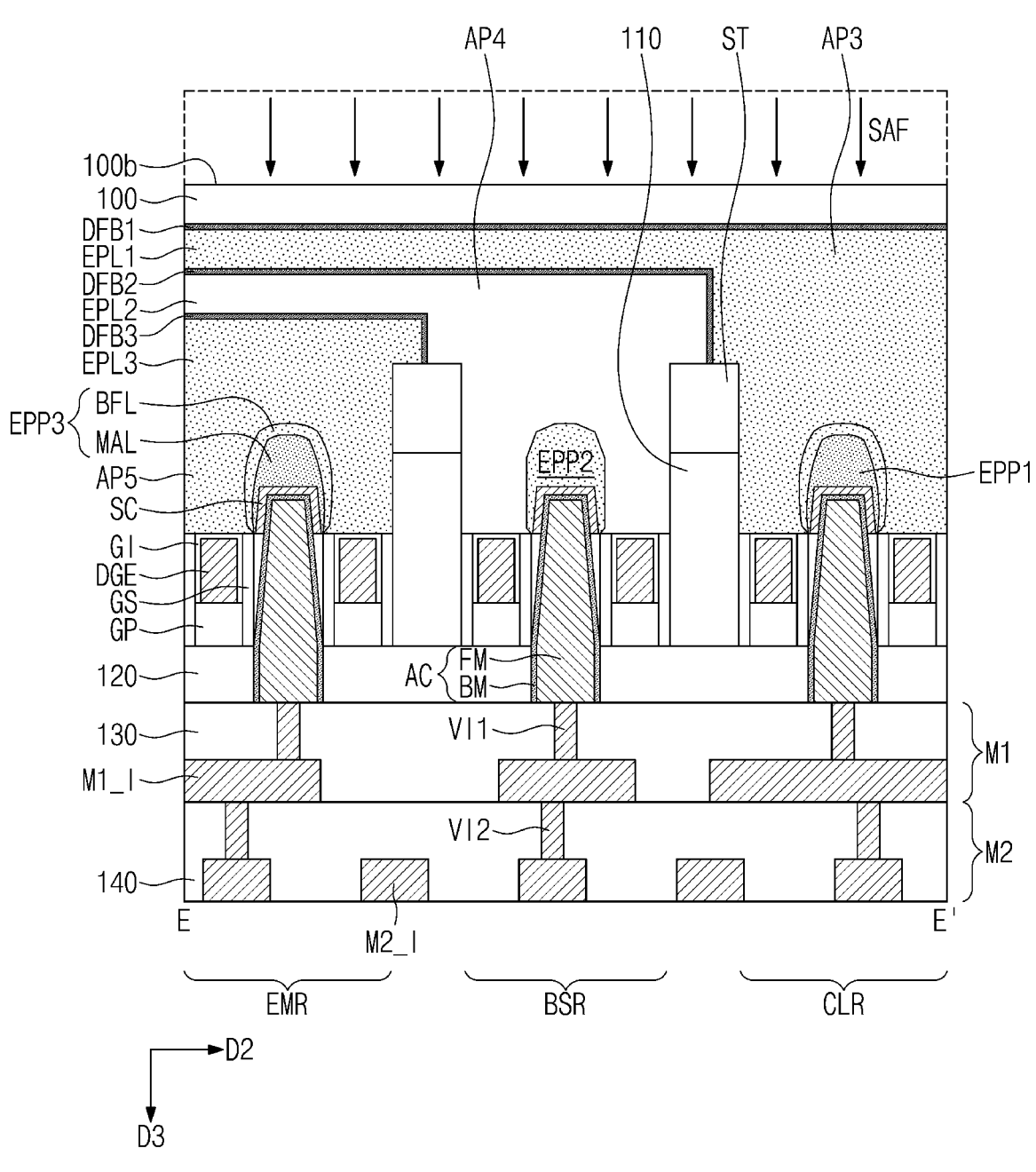
Figure 14B:
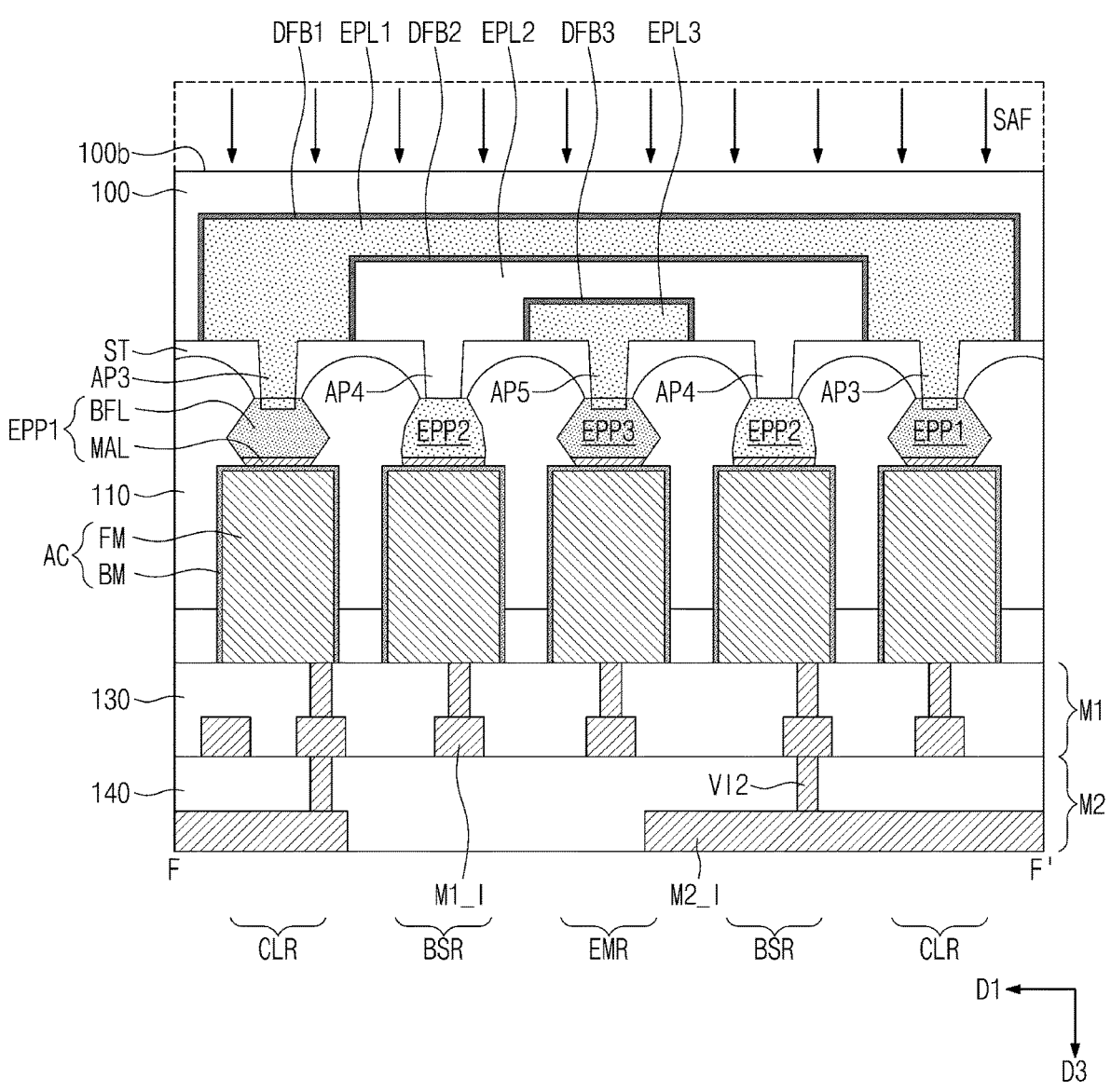

Referring to FIGS. 14A and 14B, after a BEOL process, the substrate 100 may be inverted such that the bottom surface 100$b$ of the substrate 100 is exposed to the outside. A planarization process SAF may be performed on the bottom surface 100$b$ of the substrate 100 to reduce the thickness of the substrate 100.

According to an embodiment of the inventive concept, since the first to third epitaxial layers EPL1 to EPL3 have a relatively small vertical thickness, it may be possible to stably prevent the first epitaxial layer EPL1 from being exposed, even when the thickness of the substrate 100 is reduced by the planarization process SAF. In an embodiment, the lower power lines VPR1 to VPR3 described with reference to FIG. 4 and FIGS. 5A to 5D may be formed on the bottom surface 100$b$ of the substrate 100. Thereafter, the power delivery network layer PDN may be formed on the bottom surface 100$b$ of the substrate 100.

Figure 15:
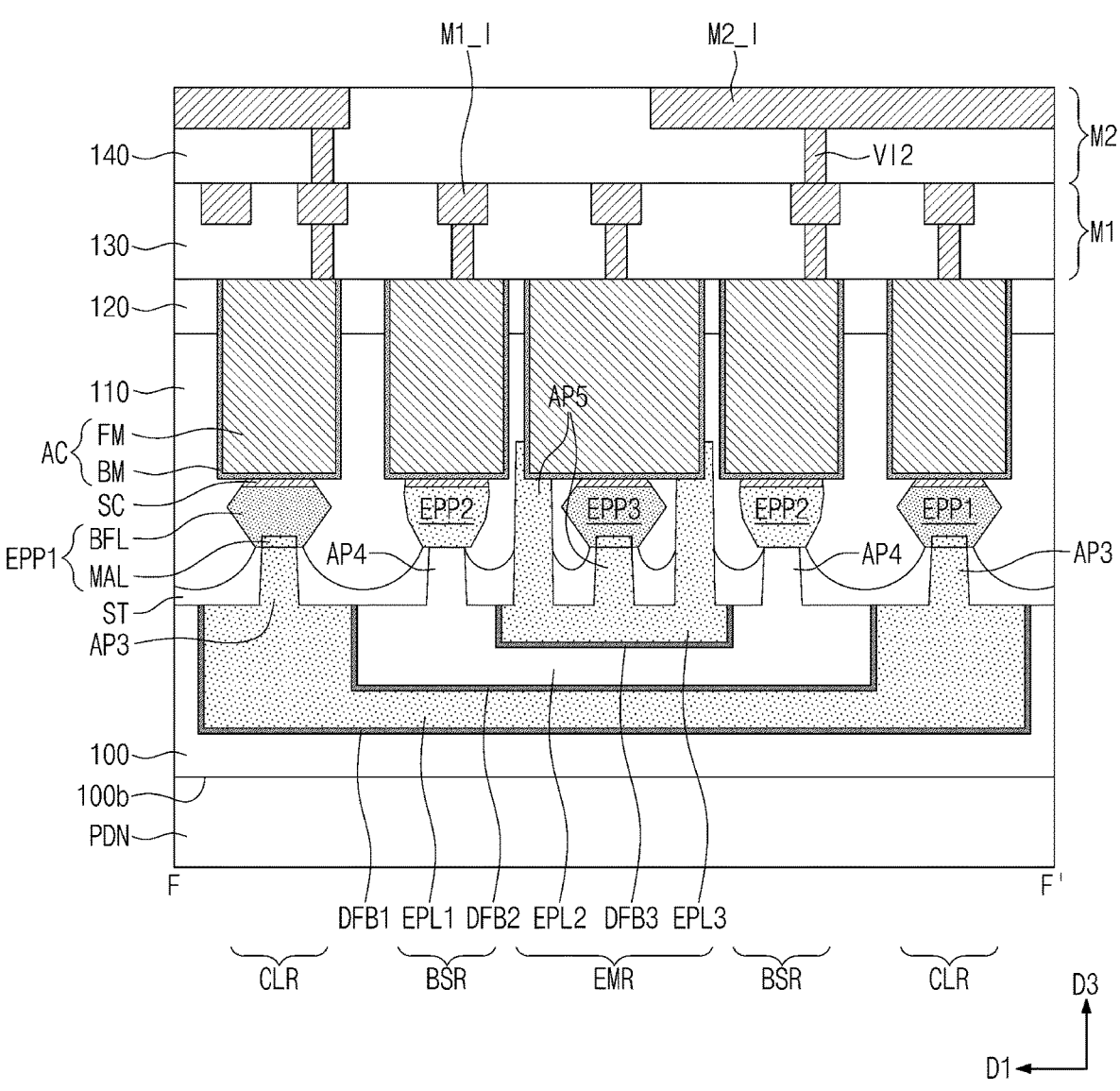
FIG. 15 is a sectional view taken along the line F-F' of FIG. 6 to illustrate a semiconductor device, according to an example embodiment of the inventive concept.

FIG. 15 is a sectional view taken along the line F-F' of FIG. 6 to illustrate a semiconductor device according to an example embodiment of the inventive concept. In the following description, an element previously described with reference to FIGS. 6, 7A, and 7B may be identified by the same reference number without repeating an overlapping description thereof.

Referring to FIG. 15, a plurality of third active patterns AP3 may be provided on the emitter region EMR. The third epitaxial pattern EPP3 may be omitted from at least one of the third active patterns AP3. The third epitaxial pattern EPP3 may be provided on another one of the third active patterns AP3. The active contact AC may be connected to both of the fifth active pattern AP5, from which the third epitaxial pattern EPP3 is omitted, and the third epitaxial pattern EPP3.

In the present embodiment, by adjusting the numbers of the third active patterns AP3 and the third epitaxial pattern EPP3 provided on the emitter region EMR, it may be possible to accurately control the electric characteristics of the vertical bipolar junction transistor.

According to an embodiment of the inventive concept, a vertical bipolar junction transistor may include an emitter, a base, and a collector, which are composed of stacked epitaxial layers. Thus, the vertical bipolar junction transistor may be formed to have a small vertical thickness. Thus, the vertical bipolar junction transistor may have a structure that is compatible with an MBCFET applied with a backside PDN, and moreover, owing to a diffusion prevention layer between the epitaxial layers, it may be possible to improve the reliability and electric characteristics of the device.

While example embodiments of the inventive concept have been particularly shown and described, it will be understood by one of ordinary skill in the art that variations in form and detail may be made therein without departing from the spirit and scope of the inventive concept.

What is claimed is:

1. A semiconductor device, comprising:
   a first epitaxial layer, a second epitaxial layer, and a third epitaxial layer sequentially stacked on a substrate, the first and third epitaxial layers having a first conductivity type, the second epitaxial layer having a second conductivity type; and
   a first diffusion prevention layer provided in at least one of a first region and a second region, the first region being between the first epitaxial layer and the second epitaxial layer, the second region being between the second epitaxial layer and the third epitaxial layer,
   wherein the first diffusion prevention layer is configured to prevent an impurity in the second epitaxial layer from being diffused,
   wherein the first epitaxial layer comprises a first active pattern in an upper portion thereof,
   wherein the second epitaxial layer comprises a second active pattern in an upper portion thereof,
   wherein the third epitaxial layer comprises a third active pattern in an upper portion thereof,
   wherein the first active pattern is provided on a collector region of the substrate,
   wherein the second active pattern is provided on a base region of the substrate, and
   wherein the third active pattern is provided on an emitter region of the substrate.

2. The semiconductor device of claim 1, further comprising a power delivery network layer on a bottom surface of the substrate.

3. The semiconductor device of claim 1, wherein a vertical thickness of the first epitaxial layer is smaller than a horizontal thickness of the first epitaxial layer.

4. The semiconductor device of claim 3, wherein the vertical thickness of the first epitaxial layer ranges from 50 nm to 200 nm.

5. The semiconductor device of claim 1, wherein the first to third epitaxial layers, which are sequentially stacked, constitute a vertical bipolar junction transistor.

6. The semiconductor device of claim 1,
   wherein the first diffusion prevention layer comprises silicon (Si) and a first diffusion prevention element,
   wherein the first diffusion prevention element is As, C, or a combination thereof, and
   wherein a concentration of the first diffusion prevention element in the first diffusion prevention layer ranges from 1 at % to 20 at %.

7. The semiconductor device of claim 6, wherein the first diffusion prevention layer further comprises the impurity diffused from the second epitaxial layer.

8. The semiconductor device of claim 1, further comprising:
   a second diffusion prevention layer provided between the substrate and the first epitaxial layer,
   wherein the first diffusion prevention layer comprises silicon (Si) and a first diffusion prevention element,
   wherein the second diffusion prevention layer comprises silicon (Si) and a second diffusion prevention element, and
   wherein the second diffusion prevention element is different from the first diffusion prevention element.

9. The semiconductor device of claim 1, further comprising:
   a first epitaxial pattern on the first active pattern;
   a second epitaxial pattern on the second active pattern; and a third epitaxial pattern on the third active pattern, wherein the first and third epitaxial patterns have the first conductivity type, and wherein the second epitaxial pattern has the second conductivity type.

10. The semiconductor device of claim 9, further comprising:

active contacts provided on the first to third epitaxial patterns, respectively; and a metal layer on the active contacts.

11. A semiconductor device, comprising:

a first epitaxial layer, a second epitaxial layer, and a third epitaxial layer sequentially stacked on a substrate, the first and third epitaxial layers having a first conductivity type, the second epitaxial layer having a second conductivity type;

a first diffusion prevention layer between the substrate and the first epitaxial layer;

a second diffusion prevention layer between the first epitaxial layer and the second epitaxial layer; and a third diffusion prevention layer between the second epitaxial layer and the third epitaxial layer, wherein the first diffusion prevention layer comprises silicon (Si) and a first diffusion prevention element, wherein the second diffusion prevention layer comprises silicon (Si) and a second diffusion prevention element, and wherein the first diffusion prevention element is different from the second diffusion prevention element.

12. The semiconductor device of claim 11, wherein the first diffusion prevention element is carbon (C), and wherein the second diffusion prevention element is arsenic (As).

13. The semiconductor device of claim 11, further comprising:

a first epitaxial pattern on a collector region of the substrate;

a second epitaxial pattern on a base region of the substrate; and a third epitaxial pattern on an emitter region of the substrate, wherein the first epitaxial pattern is connected to the first epitaxial layer, wherein the second epitaxial pattern is connected to the second epitaxial layer, and wherein the third epitaxial pattern is connected to the third epitaxial layer.

14. The semiconductor device of claim 11, wherein a vertical thickness of the first epitaxial layer is smaller than a horizontal thickness of the first epitaxial layer.

15. The semiconductor device of claim 11, further comprising a power delivery network layer on a bottom surface of the substrate.

16. A semiconductor device, comprising:

a first epitaxial layer, a second epitaxial layer, and a third epitaxial layer sequentially stacked on a substrate, the first and third epitaxial layers having a first conductivity type, the second epitaxial layer having a second conductivity type;

a first diffusion prevention layer between the first epitaxial layer and the second epitaxial layer;

a second diffusion prevention layer between the second epitaxial layer and the third epitaxial layer; and a power delivery network layer on a bottom surface of the substrate, wherein the substrate has a first thickness in a vertical direction, wherein a total thickness of the first to third epitaxial layers, which are sequentially stacked, is a second thickness, and wherein the first thickness is larger than the second thickness.

17. The semiconductor device of claim 16, wherein each of the first and second diffusion prevention layers comprises silicon (Si) and a first diffusion prevention element, wherein the first diffusion prevention element comprises As, C, or a combination thereof, and wherein a concentration of the first diffusion prevention element in the first diffusion prevention layer ranges from 1 at % to 20 at %.

18. The semiconductor device of claim 16, wherein a vertical thickness of the first epitaxial layer is smaller than a horizontal thickness of the first epitaxial layer.

19. The semiconductor device of claim 16, further comprising:

a first epitaxial pattern on a collector region of the substrate;

a second epitaxial pattern on a base region of the substrate; and a third epitaxial pattern on an emitter region of the substrate, wherein the first epitaxial pattern is connected to the first epitaxial layer, wherein the second epitaxial pattern is connected to the second epitaxial layer, and wherein the third epitaxial pattern is connected to the third epitaxial layer.

20. The semiconductor device of claim 19, further comprising:

an active pattern on the emitter region, wherein the active pattern is adjacent to the third epitaxial pattern and is connected to the third epitaxial layer, and wherein both of the third epitaxial pattern and the active pattern are connected to an active contact.

* * * * *